US012638770B2

(12) United States Patent
Ryu et al.

(10) Patent No.: US 12,638,770 B2
(45) Date of Patent: May 26, 2026

(54) BLOCK COPOLYMER FOR LITHOGRAPHY AND LITHOGRAPHY METHOD USING THE SAME

(71) Applicant: INDUSTRY-ACADEMIC COOPERATION FOUNDATION, YONSEI UNIVERSITY, Seoul (KR)

(72) Inventors: Du Yeol Ryu, Seoul (KR); Hui Il Jeon, Seoul (KR); Seungbae Jeon, Seoul (KR); Seungyun Jo, Seoul (KR)

(73) Assignee: Industry-Academic Cooperation Foundation, Yonsei University, Seoul (KR)

(*) Notice: Subject to any disclaimer, the term of this patent is extended or adjusted under 35 U.S.C. 154(b) by 789 days.

(21) Appl. No.: 17/960,362

(22) Filed: Oct. 5, 2022

(65) Prior Publication Data

US 2023/0367215 A1 Nov. 16, 2023

(30) Foreign Application Priority Data

May 12, 2022 (KR) ........................ 10-2022-0058206

(51) Int. Cl.
*G03F 7/075* (2006.01)
*G03F 7/20* (2006.01)
*G03F 7/34* (2006.01)

(52) U.S. Cl.
CPC .......... *G03F 7/0757* (2013.01); *G03F 7/2002* (2013.01); *G03F 7/346* (2013.01)

(58) Field of Classification Search
None
See application file for complete search history.

(56) References Cited

U.S. PATENT DOCUMENTS

2004/0099307 A1 5/2004 Sun
2008/0038467 A1* 2/2008 Jagannathan .......... B82Y 20/00 427/532
2013/0059438 A1 3/2013 Zhou et al.
2013/0224442 A1 8/2013 Kim et al.
(Continued)

FOREIGN PATENT DOCUMENTS

CN 1711647 A 12/2005
CN 106349439 A * 1/2017 .......... C08F 293/005
(Continued)

OTHER PUBLICATIONS

Translated Description of Wang et al.(Year: 2017).*
(Continued)

*Primary Examiner* — Mark F. Huff
*Assistant Examiner* — Andrew Preston Traywick
(74) *Attorney, Agent, or Firm* — HARNESS, DICKEY & PIERCE, P.L.C.

(57) ABSTRACT

The inventive concept relates to a block copolymer for lithography, capable of self-assembling and self-healing, and more particularly, to a block copolymer including a first block which is a repeating unit of polymerized siloxane and a second block which is a repeating unit of polymerized alkyl azobenzene acrylate. The alkyl is a linear or branched chain of 1 to 10 carbon atoms, the number (x) of the repeating unit of polymerized siloxane is about 60 to about 80, and the number (y) of the repeating unit of polymerized alkyl azobenzene acrylate is about 15 to about 25. The block copolymer has a cylindrical phase.

20 Claims, 27 Drawing Sheets

(56) References Cited

U.S. PATENT DOCUMENTS

| | | | |
|---|---|---|---|
| 2015/0225601 A1* | 8/2015 | Komatsu | C08F 212/08 524/308 |
| 2016/0071740 A1 | 3/2016 | Kodera et al. | |
| 2019/0270852 A1 | 9/2019 | Yamazaki et al. | |
| 2019/0302520 A1* | 10/2019 | Hasegawa | G02F 1/1368 |
| 2021/0269666 A1* | 9/2021 | Ota | C09D 7/70 |

FOREIGN PATENT DOCUMENTS

| | | | |
|---|---|---|---|
| CN | 110066370 | B | 8/2020 |
| JP | 2011/236333 | A | 11/2011 |

OTHER PUBLICATIONS

Zhang X, et al., Abnormal fast dehydration and rehydration of light- and thermo-dual-responsive copolymer films triggered by UV radiation, Soft Matter, Mar. 11, 2021;17(9):2603-2613. doi: 10.1039/d0sm02007a. PMID: 33527960.

* cited by examiner

Embodiment Example

Comparative Example 1

Comparative Example 2

BLOCK COPOLYMER FOR LITHOGRAPHY AND LITHOGRAPHY METHOD USING THE SAME

CROSS-REFERENCE TO RELATED APPLICATIONS

This U.S. non-provisional patent application claims priority under 35 U.S.C. § 119 of Korean Patent Application No. 10-2022-0058206, filed on May 12, 2022, the entire contents of which are hereby incorporated by reference.

BACKGROUND

The present disclosure herein relates to a block copolymer for lithography capable of self-assembling and self-healing, and a lithography method using the same.

The self-assembly technology of block copolymers receives attention as a next-generation lithography technology. Since the self-assembly of block copolymers uses thermodynamically spontaneous behavior between polymers, fine patterns may be manufactured based on a small molecular weight and a high Flory-Huggins interaction parameter.

For example, by using the self-assembly of polystyrene-block-polymethylmethacrylate (PS-b-PMMA), fine patterns may be formed. However, in order to form smaller nanopatterns, a block copolymer having a higher Flory-Huggins interaction parameter than the PS-b-PMMA is required. In addition, the molecular weight distribution of the block copolymer is required to be narrow, and the interface between the two domains is required to be clear.

The defect-free nanopatterns is required to apply the self-assembly technology of the block copolymer to lithography. In addition, directed self-assembly (DSA) capable of controlling nanopatterns in a large area is necessary. Generally, the directed self-assembly utilizes epitaxial self-assembly forming the uniform nanopatterns from a block copolymer, or graphoepitaxy controlling the arrangement of nanopatterns using the guided trenches formed by an etch process. Recently, directed self-assembly methods using electric field annealing or zone annealing are being suggested.

SUMMARY

The task for solving of the present disclosure is to provide a block copolymer for lithography, capable of self-assembling and self-healing.

Another task for solving of the present disclosure is to provide a lithography method using the block copolymer.

According to an embodiment of the inventive concept, a block copolymer for lithography includes: a first block including a first repeating unit of Formula 1; and a second block including a second repeating unit of Formula 2.

[Formula 1]

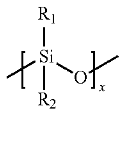

$R_1$ and $R_2$ are each independently hydrogen or a linear or branched alkyl group of 1 to 10 carbon atoms, and "x" is an integer between 60 and 80.

[Formula 2]

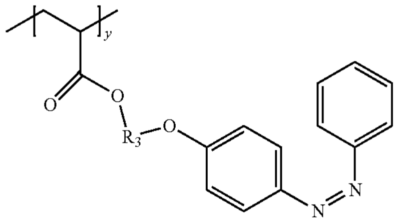

$R_3$ is a linear or branched alkyl group of 1 to 10 carbon atoms, "y" is an integer between 15 and 25, and the block copolymer may have a cylindrical phase.

According to another embodiment of the inventive concept, a lithography method includes: forming a polymer layer including a block copolymer on a substrate; applying an electric field to the polymer layer to form a first nanostructure and a second nanostructure, extended in parallel to each other in a first direction; and selectively removing the first nanostructure. The block copolymer may include: a first block which is a repeating unit of polymerized siloxane; and a second block which is a repeating unit of polymerized alkyl azobenzene acrylate. The alkyl may be a linear or branched chain of 1 to 10 carbon atoms, a number (x) of the repeating unit of the polymerized siloxane may be 60 to 80, a number (y) of the repeating unit of the alkyl azobenzene acrylate may be 15 to 25, the first nanostructure may include the first block, and the second nanostructure may include the second block.

According to another embodiment of the inventive concept, a method of manufacturing a semiconductor device includes: forming transistors on a substrate; and forming wirings extended in a first direction on the transistors. The forming of the wirings may include: forming an etch target layer on the transistors; forming a polymer layer including a block copolymer on the etch target layer; applying an electric field to the polymer layer to form first nanostructures and second nanostructures extended in parallel to each other in the first direction; selectively removing the first nanostructures; and patterning the etch target layer using the second nanostructures as an etching mask. The block copolymer may include: a first block which is a polymer of a silicon (Si) backbone; and a second block which is a repeating unit of polymerized monomers including azobenzene. A ratio of a volume of the first block to a volume of the block copolymer may be about 0.45 to about 0.55, each of the first nanostructures may include the first block, and each of the second nanostructures may include the second block.

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION

Figure 1:
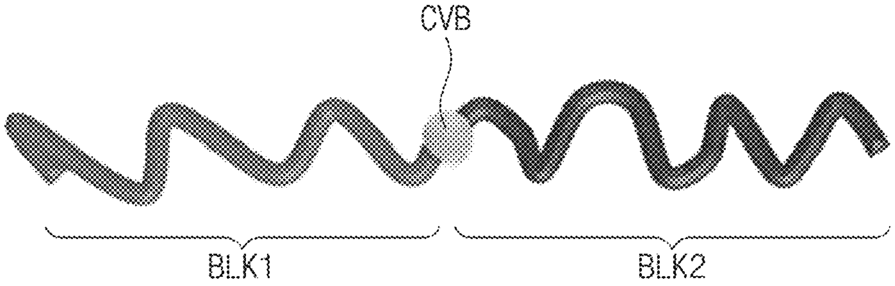
FIG. 1 is a concept diagram for explaining a block copolymer according to embodiments of the inventive concept.

Preferred embodiments of the inventive concept will be explained with reference to the accompany drawings for sufficient understanding of the configurations and effects of the inventive concept. The inventive concept may, however, be embodied in various forms, have various modifications and should not be construed as limited to the embodiments set forth herein. The embodiments are provided to complete the disclosure of the inventive concept through the explanation of the embodiments and to completely inform a person having ordinary knowledge in this technical field to which the inventive concept belongs of the scope of the inventive concept.

In the disclosure, it will be understood that when an element is referred to as being on another element, it can be directly formed on the other element, or a third intervening element may be present. In the drawings, the thicknesses of elements may be exaggerated for effective explanation of technical contents. In the disclosure, parts designated by the same reference numerals refer to the same configuration elements throughout.

Example embodiments are described herein with reference to cross-sectional views and/or plan views that are illustrations of idealized example embodiments. In the drawings, the thicknesses of layers and regions may be exaggerated for effective explanation of technical contents. Thus, the regions illustrated in the drawings are schematic in nature and their shapes are not intended to illustrate the actual shape of a region of a device and are not intended to limit the scope of the inventive concept. In various example embodiments in the disclosure, although the terms first, second, third, etc. may be used herein to describe various elements, these elements should not be limited by these terms. These terms are only used to distinguish one element from another element. Embodiments explained and illustrated herein may include their complementary embodiments.

The terminology used herein is for the purpose of describing example embodiments only and is not intended to be limiting of the inventive concept. In the disclosure, the singular forms are intended to include the plural forms as well, unless the context clearly indicates otherwise. It will be further understood that the terms "comprises" and/or "comprising," when used in this specification, specify the presence of stated elements, but do not preclude the presence or addition of one or more other elements.

An "alkyl" described in the present disclosure means a functional group with a linear or branched chain type of 1 to 10 carbon atoms.

FIG. 1 is a concept diagram for explaining a block copolymer according to embodiments of the inventive concept. Referring to FIG. 1, a block copolymer may include a first block BLK1 which is a repeating unit obtained by polymerizing a first monomer, and a second block BLK2 which is a repeating unit obtained by polymerizing a second monomer. The first block BLK1 and the second block BLK2 may be bonded from each other by a covalent bond CVB.

The block copolymer according to the inventive concept may have a Flory-Huggins interaction parameter (x) of about 0.25 to about 0.5. More particularly, the block copolymer according to the inventive concept may have a λ value of about 0.3 to about 0.5. Generally, a block copolymer having a λ value greater than about 0.25 may be considered to have a high Flory-Higgins interaction parameter. The Flory-Huggins interaction parameter is a value representing the degree of dislike of the first block BLK1 and the second block BLK2 from each other. In other words, the block copolymer according to the inventive concept may have large repulsive force between the first block BLK1 and the second block BLK2. Thus, the block copolymer according to the inventive concept may have a specific phase (or structure) through self-assembly, though having a low degree of polymerization (N).

Figure 2A:
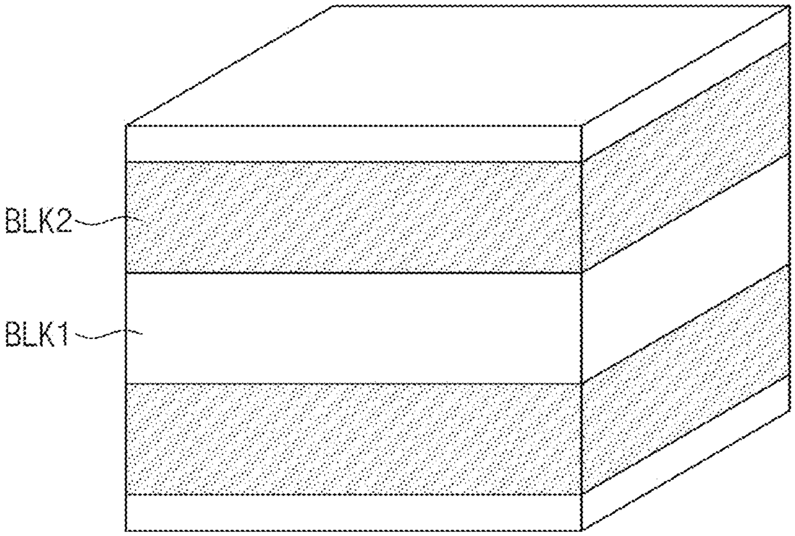
FIG. 2A and FIG. 2B are concept diagrams for explaining phases (or structures) of self-assembled block copolymers.
Figure 2B:
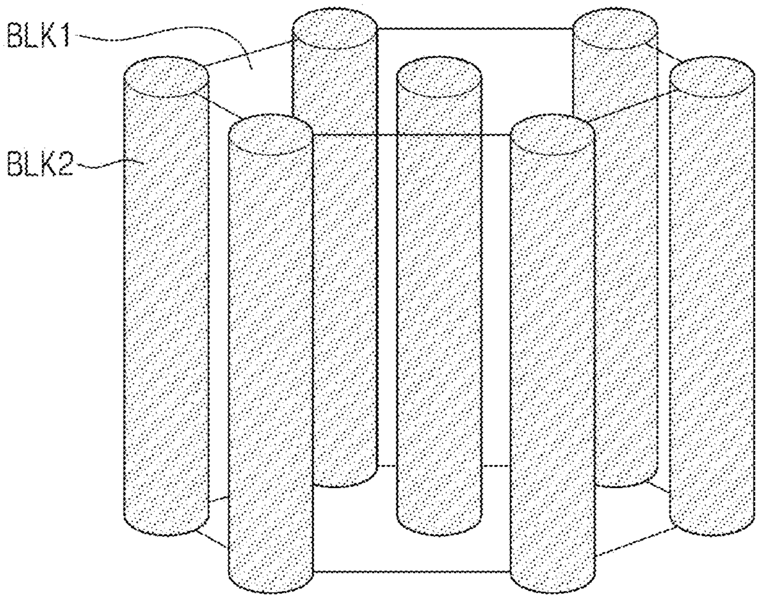

FIG. 2A and FIG. 2B are concept diagrams for explaining phases (or structures) of self-assembled block copolymers.

Referring to FIG. 2A, the block copolymer of FIG. 1 may have a lamellar phase through self-assembly. The lamella phase may include a first layer composed of the first block BLK1 and a second layer composed of the second block BLK2. The first and second layers may be alternately stacked.

Referring to FIG. 2B, the block copolymers of FIG. 1 may have a cylindrical phase through self-assembly. For example, the cylindrical phase may include a cylindrical structure composed of the second block BLK2. The first block BLK1 may fill up spaces among the cylindrical structures composed of the second block BLK2.

The block copolymer may have a lamellar phase, a cylindrical phase, or a mixed phase of lamellar and cylindrical phases according to the degree of polymerization (N) and the volume fraction between the first block BLK1 and the second block BLK2.

The block copolymer according to an embodiment of the inventive concept may be made to have a cylindrical phase by controlling the volume fraction between the first block BLK1 and the second block BLK2 with a small degree of polymerization (N) of about 75 to about 105.

Referring to FIG. 1 again, the first block BLK1 of the block copolymer according to embodiments of the inventive concept may include a repeating unit of Formula 1.

[Formula 1]

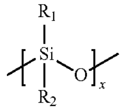

In Formula 1, $R_1$ and $R_2$ may be each independently a linear or branched alkyl group of 1 to 10 carbon atoms. "x" may be an integer between 60 and 80. As shown in Formula 1, the first block BLK1 may be a polymer of a silicon (Si) backbone.

The second block BLK2 of the block copolymer according to embodiments of the inventive concept may include a repeating unit of Formula 2.

[Formula 2]

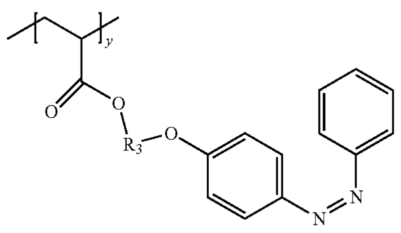

In Formula 2, $R_3$ may be a linear or branched alkyl group of 1 to 10 carbon atoms. "y" may be an integer between 15 and 25. As shown in Formula 2, the monomer of the second block BLK2 may include azobenzene.

The block copolymer according to embodiments of the inventive concept may have a molecular weight of about 5,000 g/mol to about 20,000 g/mol.

Figure 3:
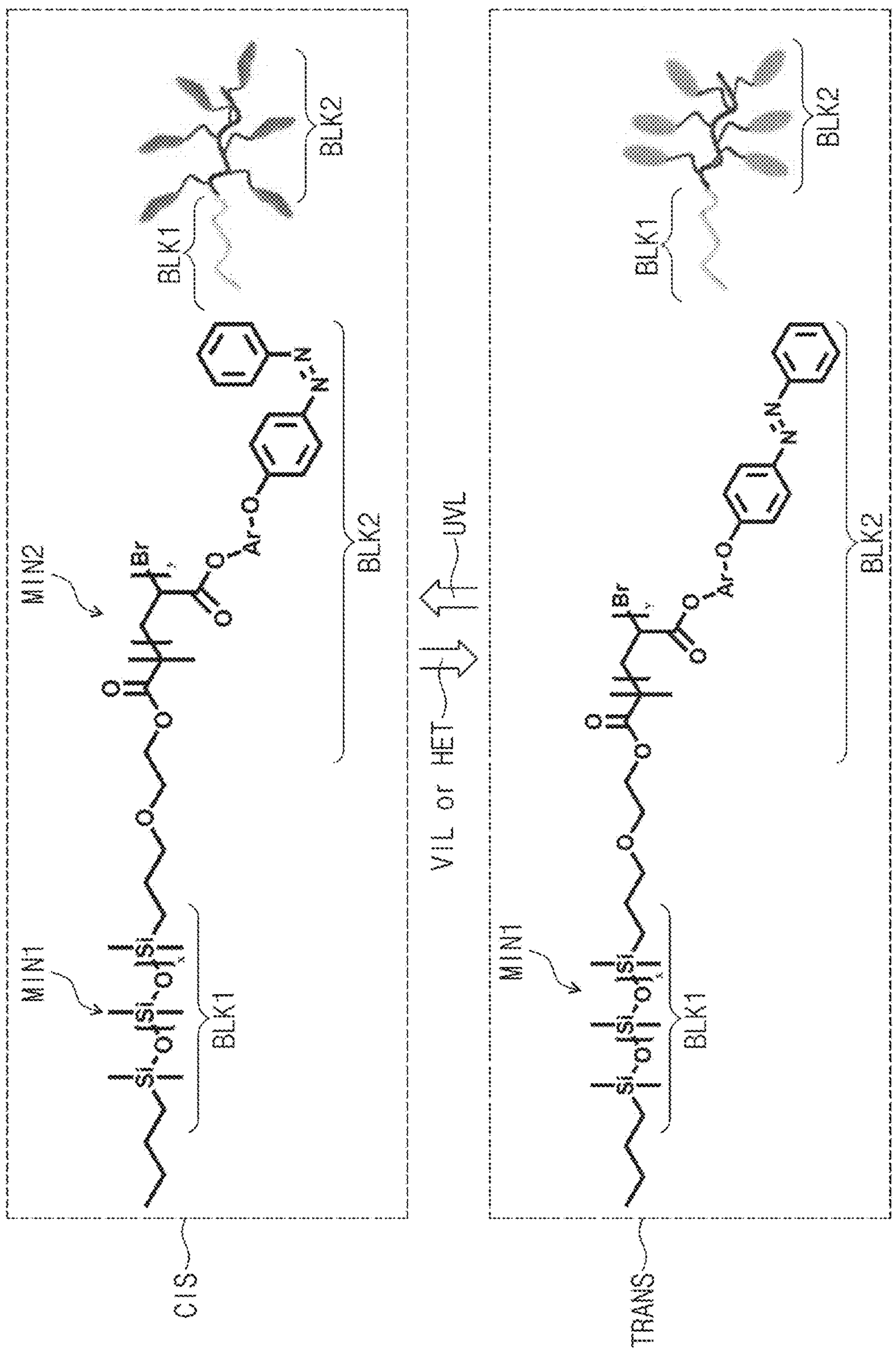
FIG. 3 is a concept diagram showing particular chemical structure of a block copolymer according to embodiments of the inventive concept.

FIG. 3 is a concept diagram showing particular chemical structure of a block copolymer according to embodiments of the inventive concept. Referring to FIG. 3, the block copolymer according to the inventive concept may include a first block BLK1 which is a repeating unit obtained by polymerizing siloxane, and a second block BLK2 which is a repeating unit obtained by polymerizing alkyl azobenzene acrylate.

The first monomer MN1 of the first block BLK1 may be siloxane. In an embodiment, the first monomer MN1 of the first block BLK1 may be dimethylsiloxane. In other words, the first block BLK1 may include polydimethylsiloxane (PDMS). In another embodiment of the inventive concept, the first monomer MN1 may be dialkylsiloxane.

The second monomer MN2 of the second block BLK2 may be alkyl azobenzene acrylate. In the chemical structure of FIG. 3, "Ar" may be a linear or branched alkyl of 1 to 10 carbon atoms. In an embodiment, the second monomer MN2 of the second block BLK2 may be hexyl azobenzene acrylate.

A lithography process using a block copolymer may include forming nanostructures with a certain pitch on a substrate. However, if a polymer layer is coated non-uniformly on the substrate, a damage region may be formed in the polymer layer due to an annealing process, a solvation process, dusts, and the suitability between materials. If an electric field or external field is applied onto the polymer layer, block copolymers may gather in the damage region to arise dewet phenomenon. This induces the defects of a lithography process. Further, the reuse of the polymer layer is impossible, and a semiconductor process may become inefficient.

The inventive concept may provide a block copolymer that may perform self-healing of the damage of a polymer layer. Through this, the inventive concept may solve the defects of a lithography process using the above-described conventional block copolymer.

Azobenzene may achieve photoisomerization between trans- and cis-structures with respect to the double bond between nitrogen atoms in a molecule by the irradiation of light with a specific wavelength band. That is, azobenzene is a photosensitive material.

If an alkyl group is introduced into azobenzene, the azobenzene may change from a trans-structure to a cis-structure by the irradiation of ultraviolet light UVL. Accordingly, the flowability of the chain of the second block BLK2 of the block copolymer may change. For example, the ultraviolet light UVL may have a wavelength of about 365 nm. If the azobenzene of the second block BLK2 has a cis-structure, the glass transition temperature of the second block BLK2 may be rapidly reduced, and the block copolymer may have similar flowability like a liquid.

If the block copolymer of an embodiment is exposed to visible light VIL, the azobenzene may change from a cis-structure to a trans-structure. Otherwise, if heat HET is applied to the block copolymer, the azobenzene may change from a cis-structure to a trans-structure. Through this, the flowability of the chain of the second block BLK2 of the block copolymer may change. In an embodiment, the visible light VIL may have a wavelength of about 470 nm. If the azobenzene of the second block BLK2 has the trans-structure, the glass transition temperature of the second block BLK2 may increase rapidly, and the block copolymer may have hard properties like a solid.

According to embodiments of the inventive concept, a damage region may be self-healed, though a polymer layer is damaged, by forming the polymer layer using a block copolymer including azobenzene that is a photosensitive material. Particular explanation will be given below.

According to embodiments of the inventive concept, a first block BLK1 and a second block BLK2, having different properties, may be synthesized into a block copolymer by using atom transfer radical polymerization (ATRP). For example, the first block BLK1 is an inorganic polymer based on a silicon backbone, and the second block BLK2 is an organic polymer, and accordingly, they may have different properties from each other. The repulsive force between the first block BLK1 and the second block BLK2 may be very large. As a result, the block copolymer according to the inventive concept may have a high Flory-Huggins interaction parameter. The block copolymer according to the inventive concept has a high Flory-Huggins interaction parameter, self-assembly may be performed easily, though the molecular weight of the block polymer is low (i.e., if the degree of polymerization is small), and a cylindrical phase may be achieved.

Referring to FIG. 3 again, the number of the repeating unit (x) of the first monomer MN1 of the block copolymer according to the inventive concept may be 60 to 80. The number of the repeating unit (y) of the second monomer MN2 of the block copolymer according to the inventive concept may be 15 to 25. The degree of polymerization (N=x+y) of the block copolymer according to the inventive concept may be 75 to 105. In other words, the size (or volume) of the block copolymer according to the inventive concept may be smaller than the block copolymer used in the conventional lithography process. Accordingly, the nano-structure formed by the block copolymer according to the inventive concept may have a line width of about 8 nm to about 20 nm, and particular explanation thereon will be given later.

If the multiplication ($\chi$*N) of the Flory-Huggins interaction parameter ($\chi$) and the degree of polymerization (N) is greater than about 10.5, a block copolymer may be self-assembled to have a lamellar phase, a cylindrical phase, or a mixed phase of lamellar and cylindrical phases. The block copolymer of the inventive concept may have various phases including a spherical phase, a gyroid phase, a cylindrical phase, a lamellar phase, and a mixed phase of lamellar and cylindrical phases, according to the volume fraction of each of the first block BLK1 and the second block BLK2.

The block copolymer according to the inventive concept may have the Flory-Huggins interaction parameter (x) of about 0.25 to about 0.5, more particularly, about 0.3 to about 0.5. Since the block copolymer according to the inventive concept has a $\chi$*N value greater than about 10.5 and may have a cylindrical phase. Particularly, the volume fraction of the first block BLK1 (that is, a ratio of the volume of the first block BLK1 with respect to the volume of the block copolymer) may be about 0.45 to about 0.55. The volume fraction of the second block BLK2 (that is, a ratio of the volume of the second block BLK2 with respect to the volume of the block copolymer) may be about 0.45 to about 0.55. If the volume fraction of the first block BLK1 or the second block BLK2 has a value within the above-described range, the block copolymer according to the inventive concept may have a cylindrical phase.

Figure 4:
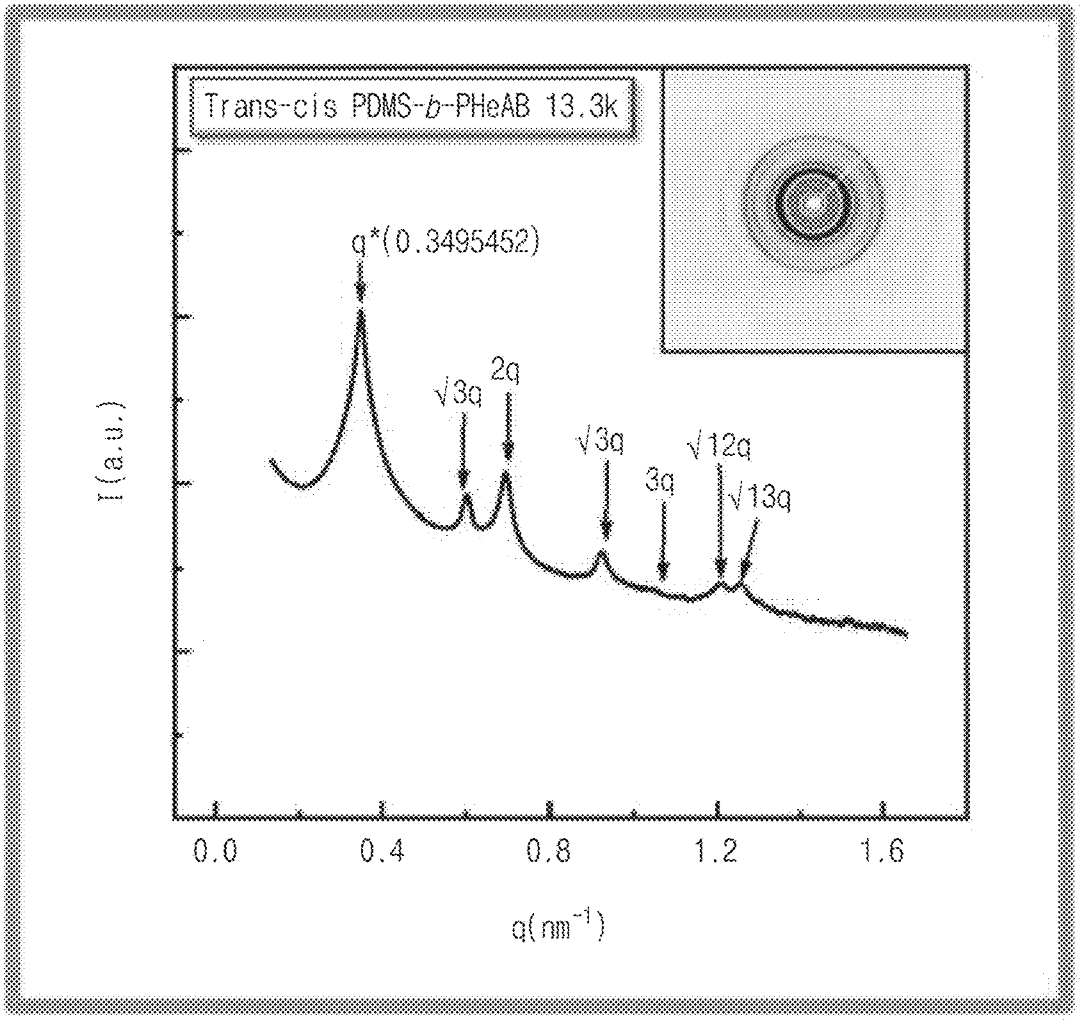
FIG. 4 is a graph showing data of the small angle X-ray scattering of a block copolymer according to an Example Embodiment of the inventive concept.

FIG. 4 is a graph showing data of the small angle X-ray scattering of a block copolymer according to an Embodiment Example of the inventive concept. The first block BLK1 of the block copolymer according to an embodiment of the inventive concept may have a volume fraction of about 0.45 to about 0.55. The small angle X-ray scattering (SAXS) of the block copolymer according to this embodiment was measured, and the resultant data are shown in FIG. 4. The block copolymer according to this embodiment has a number average molecular weight of about 13.3 kg/mol and a dispersibility of about 1.10. On the graph of the small angle scattering, the scattering peaks of polydimethylsiloxane-block-polyazobenzene are shown due to the self-assembly of the first block BLK1 and the second block BLK2.

Referring to FIG. 4, the first peak, the second peak, the third peak and the fourth peak may have a ratio of about 1:√3:2:√7. Accordingly, the block copolymer of this embodiment is confirmed to have a cylindrical phase (or structure). In addition, the sum (that is, the domain spacing between grids) of the line width of the first block BLK1 and the line width of the second block BLK2 was computed as about 17.98 nm through Bragg's law with the x-value (0.3495452) of the first peak. The domain spacing between grids is the sum of the line width of the first block BLK1 and the line width of the second block BLK2. For example, the line width of the first block BLK1 or the line width of the second block BLK2 was confirmed about 9 nm. Particular explanation thereon will be given later.

Figure 5A:
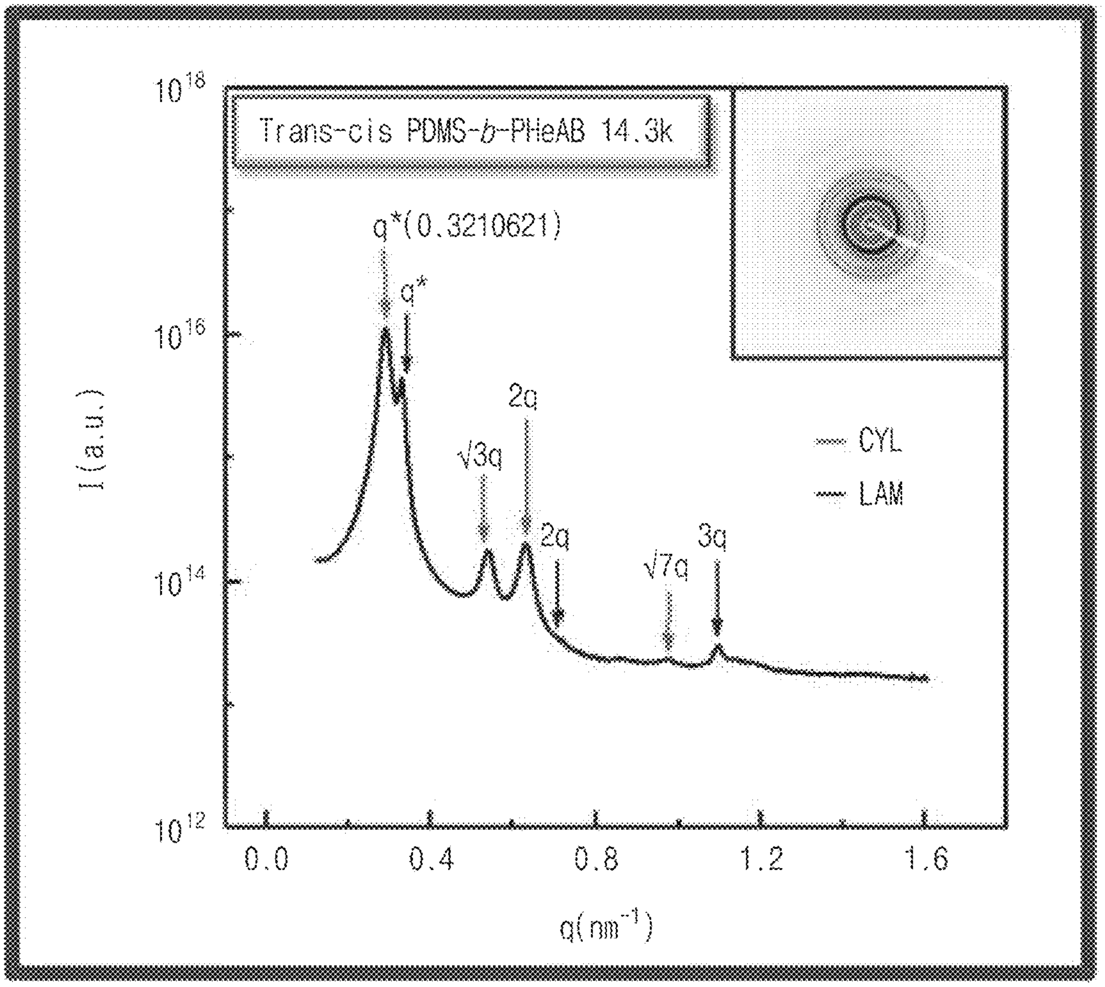
FIG. 5A is a graph showing data of the small-angle X-ray scattering of a block copolymer according to Comparative Example 1.

The volume fraction of the first block BLK1 of a block copolymer according to Comparative Example 1 may be about 0.35 to about 0.45. The small angle X-ray scattering of the block copolymer according to Comparative Example 1 was measured, and the resultant data are shown in FIG. 5A. The volume fraction of the first block BLK1 of the block copolymer according to Comparative Example 2 may be about 0.55 to about 0.65. The small angle X-ray scattering of the block copolymer according to Comparative Example 2 was measured, and the resultant data are shown in FIG. 5B.

Figure 5B:
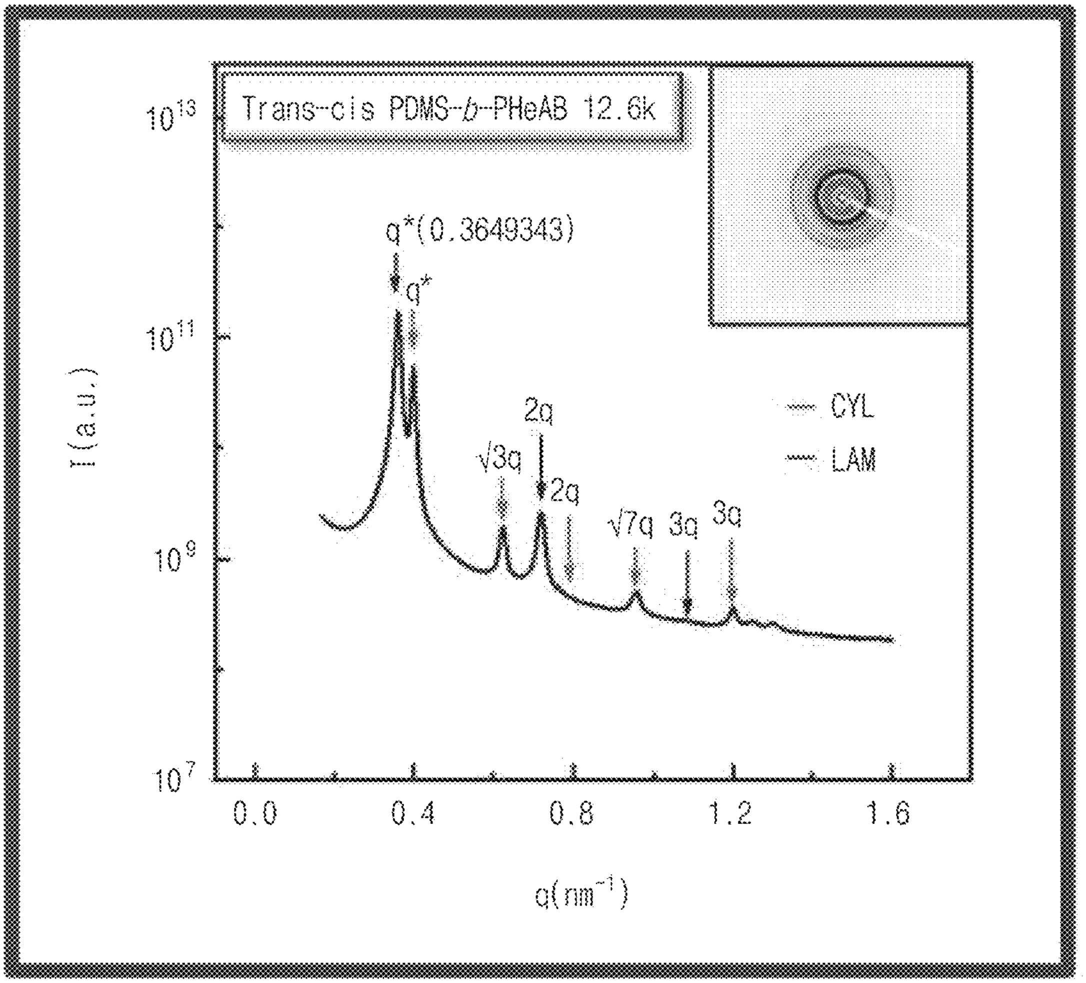
FIG. 5B is a graph showing data of the small-angle X-ray scattering of a block copolymer according to Comparative Example 2.

Referring to FIG. 5A and FIG. 5B, the peaks of a lamellar phase were measured as well as the peaks of a cylindrical phase, different from the above-explained FIG. 4. That is, it could be confirmed that the block copolymer according to Comparative Example 1 and the block copolymer according to Comparative Example 2 have a mixed phase of lamellar and cylindrical phases.

Referring to the above-described FIG. 4, FIG. 5A and FIG. 5B, in order that the block copolymer of the inventive concept has a single cylindrical phase, the volume fraction of the first block BLK1 is required to be about 0.45 to about 0.55, and if the volume fraction of the first block BLK1 deviates from the above-described range, the block copolymer may not have a single cylindrical phase.

A general block copolymer has conformational symmetry between the first block BLK1 and the second block BLK2 of FIG. 1. Accordingly, if the volume fraction of the first block BLK1 is about 0.45 to about 0.55, the block copolymer may have a lamellar phase as in FIG. 2A.

However, the block copolymer of the inventive concept has very different properties between the first block BLK1 and the second block BLK2 and has conformational asymmetry between the first block BLK1 and the second block BLK2. Particularly, the first block BLK1 of the inventive concept of PDMS has soft properties, but the second block BLK2 is a liquid crystal polymer and has hard properties. Accordingly, if the volume fraction of the first block BLK1 is about 0.45 to about 0.55, the block copolymer of the inventive concept may have a cylindrical phase as in FIG. 2B.

Experimental Example

To a 100 ml flask, 1 g of a polydimethylsiloxane bromide polymer, 0.03 g of copper bromide, 10 g of hexyl azobenzene acrylate, and a magnetic bar were added. The polydimethylsiloxane bromide polymer was synthesized through Reaction 1 below.

[Reaction 1]

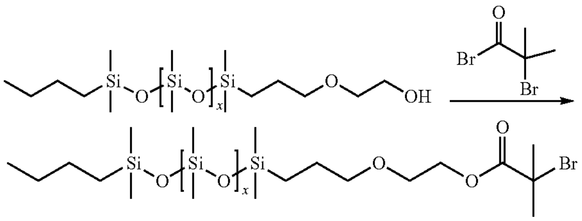

Hexyl azobenzene acrylate was synthesized using condensation polymerization and a Steglich esterification reaction method. Hexyl azobenzene acrylate may be represented by Formula 3 below.

[Formula 3]

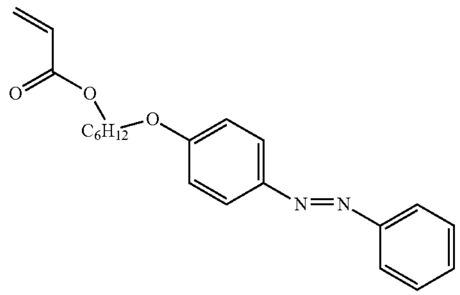

An inert atmosphere was made by injecting an argon gas into the flask, and 8 ml of toluene was additionally injected thereto. Into the flask, 100 μl of diethylenetriamine was injected, and the reaction was performed for about 24 hours to about 48 hours while maintaining about 85° C. in an oil-bath.

The reaction may use ATRP between copper bromide and a polydimethylsiloxane bromide initiator in a nonpolar solvent such as toluene. As a result, the block copolymer according to this embodiment may be synthesized by Reaction 2 below.

Figure 6:
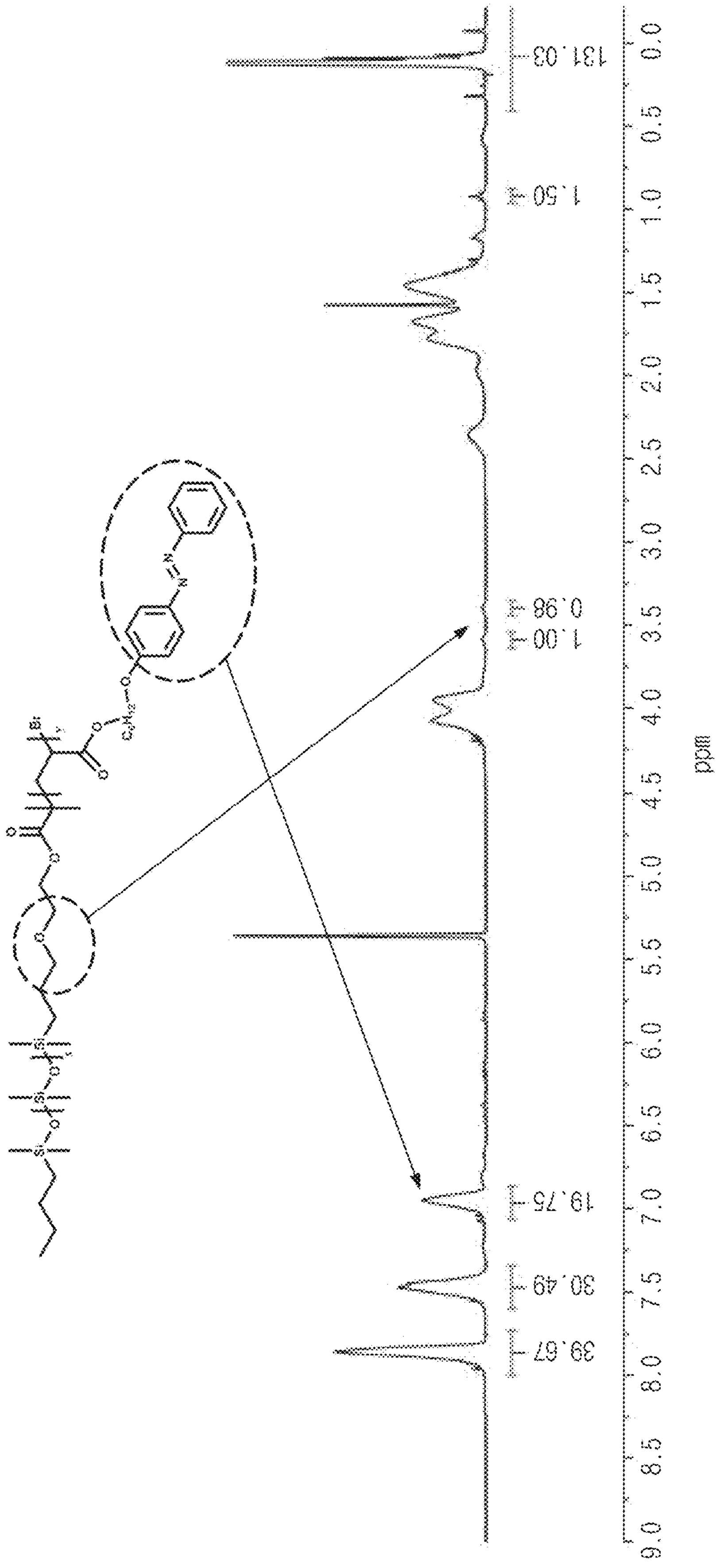
FIG. 6 shows NMR data of a block copolymer of the inventive concept, prepared through an Experimental Example of the inventive concept.

FIG. 6 shows NMR data of a block copolymer of the inventive concept, prepared through an Experimental Example of the inventive concept. Referring to FIG. 6, each volume fraction of the first block BLK1 and the second block BLK2 of the block copolymer could be confirmed.

The peaks shown at 7.0 ppm to 8.0 ppm in FIG. 6 correspond to H atoms in a benzene ring of azobenzene. The peaks shown between 3.5 ppm and 3.7 ppm correspond to H atoms of $CH_2$ of the carbonyl group of polydimethylsiloxane. When comparing the integration values of the peaks based on the number of H, the ratio of the number of the repeating units (x) of the first monomer MN1 and the number of the repeating units (y) of the second monomer MN2 in FIG. 3 was confirmed about 74:16 to 20. More particularly, it was confirmed that the number of the repeating units (x) of the first monomer MN1 was 74, and the number of the repeating units (y) of the second monomer MN2 was 20.

Referring to other experimental examples, the number of the repeating units (x) of the first monomer MN1 may be 60 to 80, as described above. The number of the repeating units (y) of the second monomer MN2 may be 15 to 25.

If "x" and "y" have values in the above-described ranges, the block copolymer according to the inventive concept may have the volume fraction of the first block BLK1 of about

[Reaction 2]

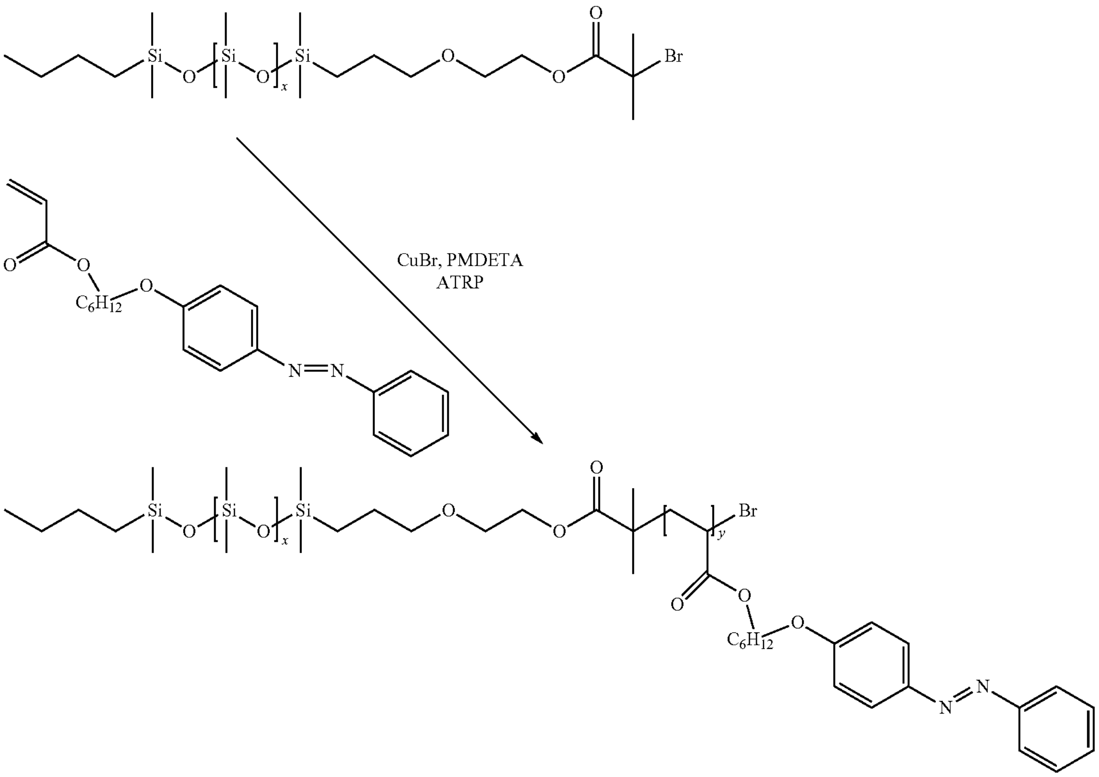

After finishing the reaction, copper bromide was separated through an alumina column. A rotary evaporator was connected with the flask, and the solvent was evaporated. The flask was precipitated with 500 ml of cold methanol, and the solvent was completely dried in a vacuum state of about 50° C. Accordingly, the block copolymer according to an embodiment of the inventive concept was obtained.

0.45 to about 0.55. Accordingly, the block copolymer of the inventive concept may have a single cylindrical phase (refer to the explanation of FIG. 4 above).

Figure 7:
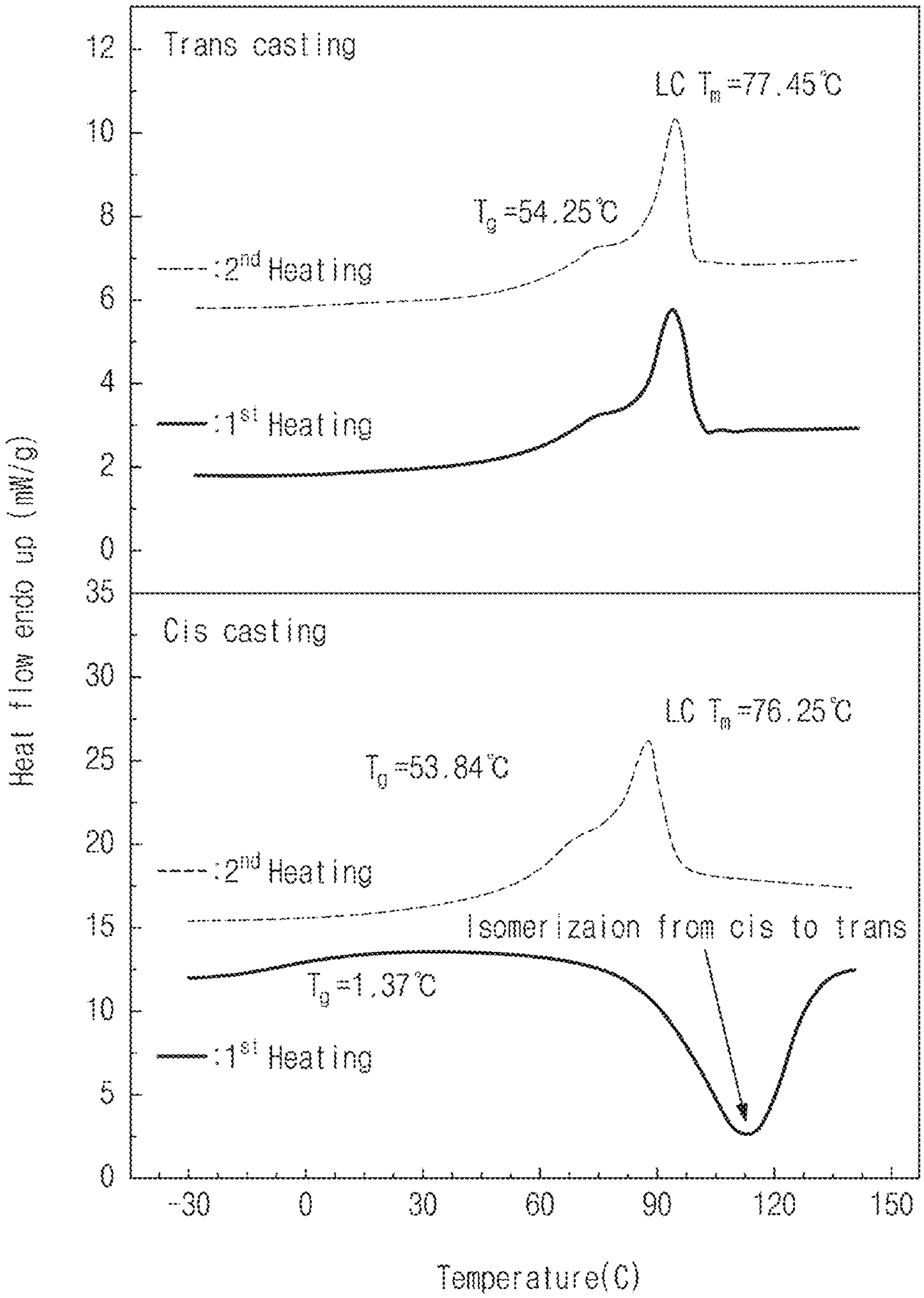
FIG. 7 shows DSC data of a block copolymer of the inventive concept, prepared through an Experimental Example of the inventive concept.

FIG. 7 shows DSC data of a block copolymer of the inventive concept, prepared through an Experimental Example of the inventive concept. With respect to the block copolymer prepared through the Experimental Example, heat flow with a temperature elevation rate of about 20° C./min was measured and shown in FIG. 7.

Referring to FIG. 7, if the azobenzene of the block copolymer has a trans-structure, the glass transition temperature ($T_g$) was measured as about 54° C., and the melting point ($T_m$) was measured as about 78° C., during both a first temperature elevation process and a second temperature elevation process.

If the azobenzene of the block copolymer has a cis-structure, the glass transition temperature ($T_g$) during the first temperature elevation process was measured as about 1° C. That is, it was confirmed that the glass transition temperature ($T_g$) of the cis-structure was very significantly reduced when compared to the glass transition temperature ($T_g$) of the trans-structure.

In the cis-structure, the liquid crystal structure of a poly azobenzene block was collapsed, and the melting point ($T_m$) was not shown. If the temperature exceeds about 90° C., it could be confirmed that the block copolymer of the cis-structure transforms into the trans-structure. For example, if the second temperature elevation process is performed after the first temperature elevation process, the same heat flow as for the above-explained trans-structure was measured. This means that the block copolymer was transformed from the cis-structure to the trans-structure through the first temperature elevation process.

Referring to FIG. 3 again, the block copolymer prepared through the Experimental Example may show the change of physical properties due to photoisomerization. The trans-structure of the block copolymer has high thermal stability and a hard state like a solid. However, the cis-structure is thermally unstable and has a fluid state like a liquid. The cis-structure is thermally unstable, as explained above referring to FIG. 7, and may be easily transformed into the trans-structure through heating.

If ultraviolet light of a specific wavelength is irradiated to the block copolymer of the inventive concept, the azobenzene of the trans-structure may absorb light energy to be excited. Thus, the azobenzene may be transformed into the unstable cis-structure. If the azobenzene has the cis-structure, packing among azobenzene molecules may not be achieved well, and steric hindrance among polymer chains may arise a lot. Accordingly, the glass transition temperature of the block copolymer may be reduced (see FIG. 7). If the block copolymer of the inventive concept has the trans-structure, it has a powder type of a solid. However, if the block copolymer has the cis-structure, it is viscous and shows fluidity.

Figure 8A:
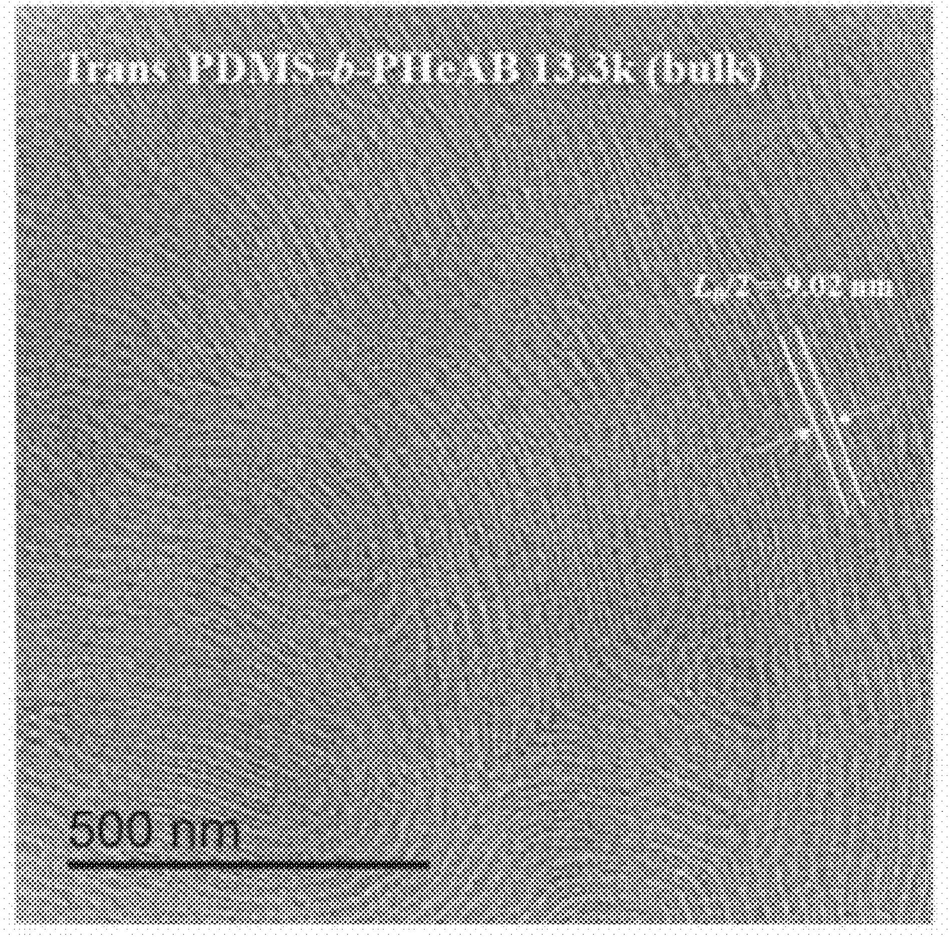
FIG. 8A and FIG. 8B show a transmission electron microscope (TEM) image and an atomic force microscope (AFM) image of a block copolymer prepared through an Experimental Example of the inventive concept.
Figure 8B:
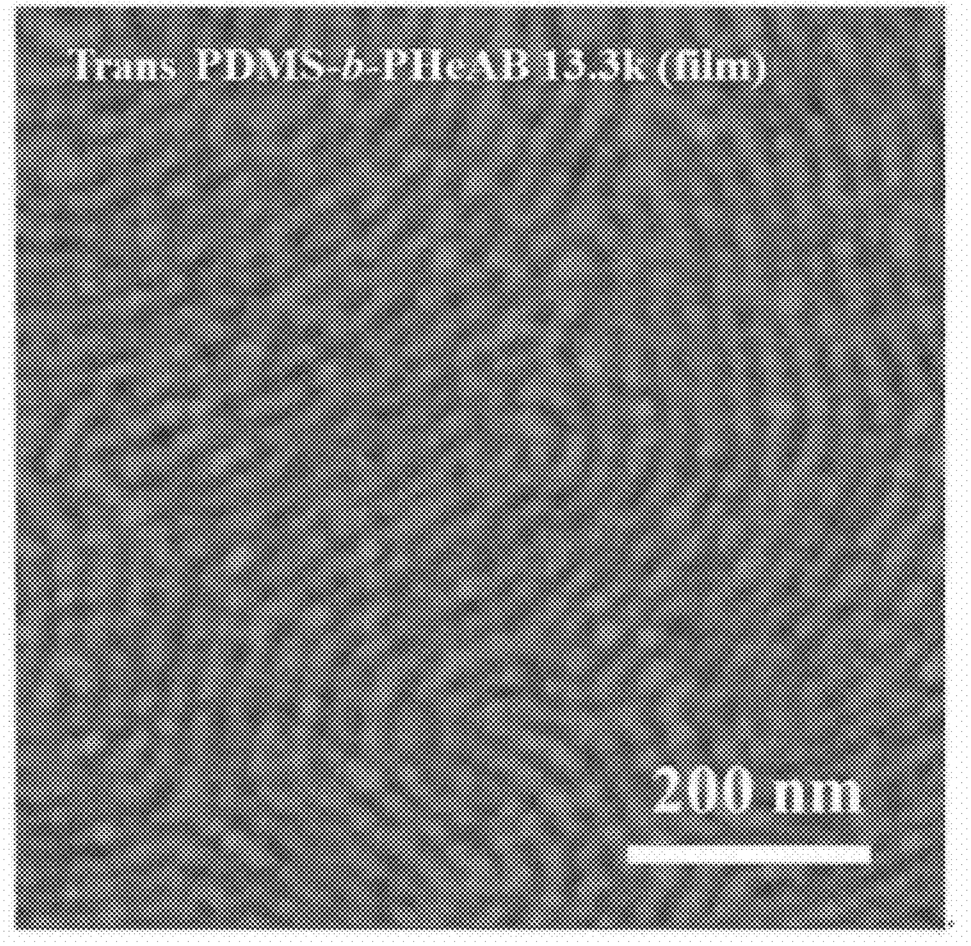

FIG. 8A and FIG. 8B show a transmission electron microscope (TEM) image and an atomic force microscope (AFM) image of a block copolymer prepared through an Experimental Example of the inventive concept.

The block copolymer of a bulk state was put on a TEM grid, and the temperature equal to or higher than the melting point (about 78° C.) of liquid crystal was applied. The block copolymer of a powder shape melted and was spread thinly on the grid to form a polymer layer. Then, the polymer layer was stood so that the block copolymer in the polymer layer undergone self-assembly. A TEM image of the polymer layer was obtained.

Referring to FIG. 8A, bright lines in the image correspond to a polydimethylsiloxane block BLK1, and dark lines correspond to a polyazobenzene block BLK2. Each of the line width of the polydimethylsiloxane block and the line width of the polyazobenzene block, measured by TEM was about 9.02 nm. The results match the X-ray scattering analysis results of FIG. 4 above.

The block copolymer and dichloroethane were mixed to prepare about 0.5 wt % to about 2 wt % of a block copolymer solution. The solution was spin coated on a substrate in about 3000 rpm to cast a polymer layer with a thickness of about 20 nm to about 70 nm. An AFM image on the polymer layer was obtained. Referring to FIG. 8B, it was confirmed that the block copolymer has a horizontal cylinder structure with a long-extended line shape like the image of FIG. 8A above.

The block copolymer prepared through the Experimental Example was mixed with dichloroethane that is a neutral solvent, to prepare 1 g of about 0.5 wt % to about 2 wt % of a block copolymer solution. Ultraviolet light was irradiated to the solution to transform the block copolymer in the solution from a trans-structure to a cis-structure. The azobenzene had a cis-structure by the ultraviolet light, and the solution showed red color. The solution was spin coated on a gold-coated substrate that is manufactured to apply an electric field in about 3000 rpm to cast a polymer layer with a thickness of about 20 nm to about 70 nm. To both electrodes of the substrate, a voltage of about 25 V/μm was applied.

Figure 9:
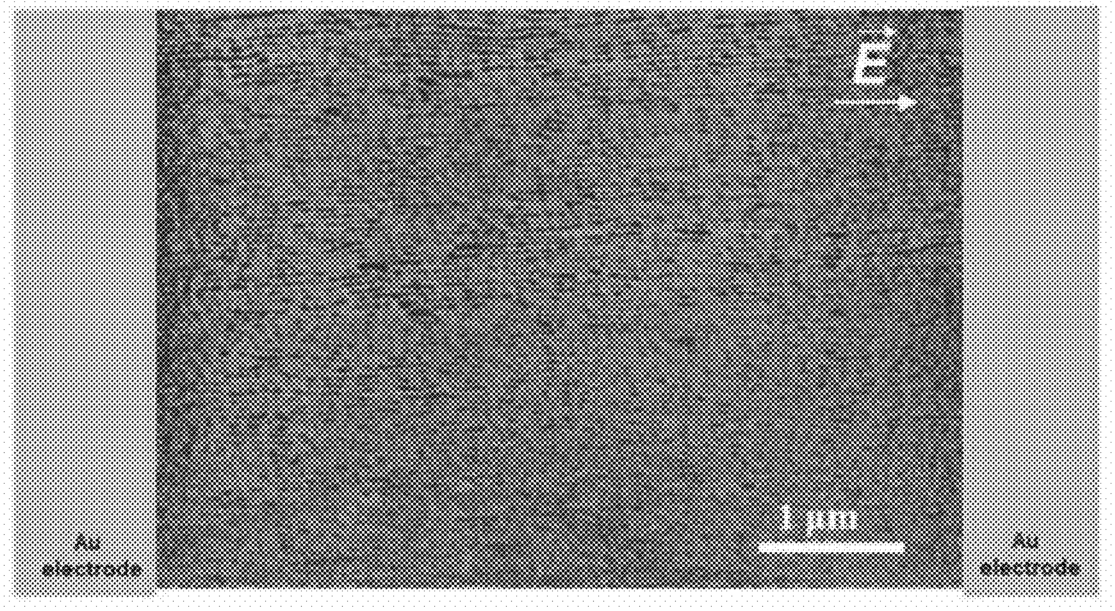
FIG. 9 shows an image of a polymer layer obtained by the self-assembly of a block copolymer of the inventive concept.

FIG. 9 shows an image of a polymer layer obtained by self-assembled block copolymer of the inventive concept. Referring to FIG. 9, it could be confirmed that the block copolymer in the polymer layer was self-assembled along the direction of the electric field.

Particularly, it could be confirmed that the polydimethylsiloxane block BLK1 and the polyazobenzene block BLK2 were extended along the direction of the electric field in a horizontal cylinder shape. When viewed from the plane, each of the cylindrical structure of the polydimethylsiloxane block BLK1 and the cylindrical structure of the polyazobenzene block BLK2 might have a line shape parallel to the direction of the electric field. The horizontal cylindrical structure in the line shape was accomplished to a length of about 6 μm.

Figure 10:
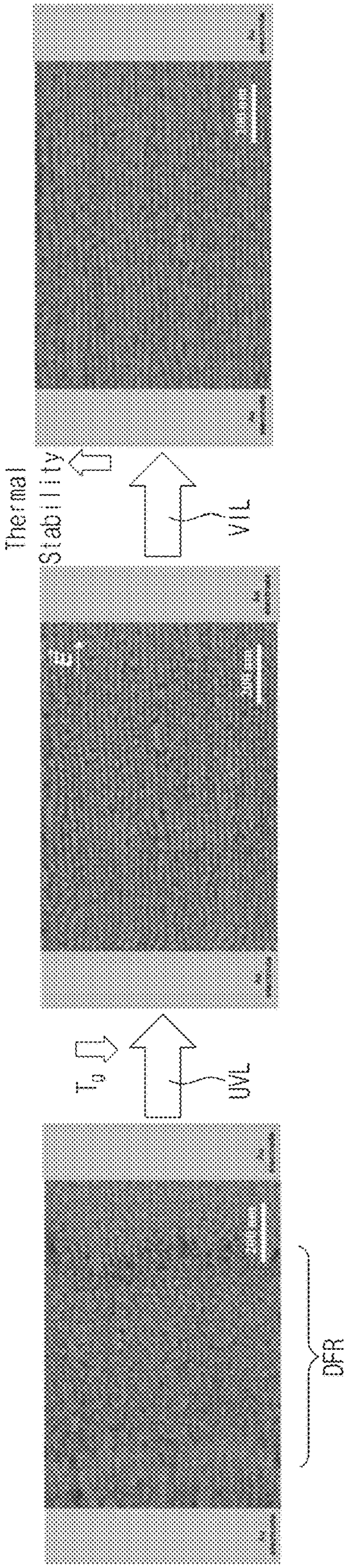
FIG. 10 shows images showing a self-healing process of a block copolymer of the inventive concept.

FIG. 10 shows images showing a self-healing process for a block copolymer of the inventive concept. Referring to FIG. 10, artificial damage was applied onto the polymer layer of FIG. 9 to form a damage region DFR. Ultraviolet light was irradiated on the polymer layer to transform the block copolymer to a cis-structure. With the transformation to the cis-structure, the fluidity of the block copolymer may increase. If an electric field is applied again to the polymer layer, the block copolymer in the damage region DFR may be self-assembled again, and the damage region DFR may be self-healed.

Then, visible light was irradiated onto the polymer layer to transform the block copolymer into a trans-structure. As a result, nanostructures (that is, planar cylindrical structures including first and second blocks) with improved thermal stability were formed. The line width of each of the nanostructures may be about 9 nm, and a line shape extended in the direction of the electric field was formed.

The nanostructures are hard and have high thermal stability, and durability on annealing and a solvent process in a semiconductor process may be high. The nanostructures may be used repeatedly. If damages are formed in the nanostructures during the repeated used, the damage may be recovered through the self-healing process of the nanostructure, explained referring to FIG. 10 above.

According to the block copolymer and a lithography process using the same according to the inventive concept, defects of lithography using the conventional block copolymer could be solved. The block copolymer according to the inventive concept may be used in a next-generation lithography process and for the manufacture of a polarization plate.

FIG. 11 to FIG. 15 are perspective views for explaining a lithography method according to embodiments of the inventive concept. FIG. 11 to FIG. 15 show a method of forming target patterns through the lithography method of the inventive concept.

Figure 11:
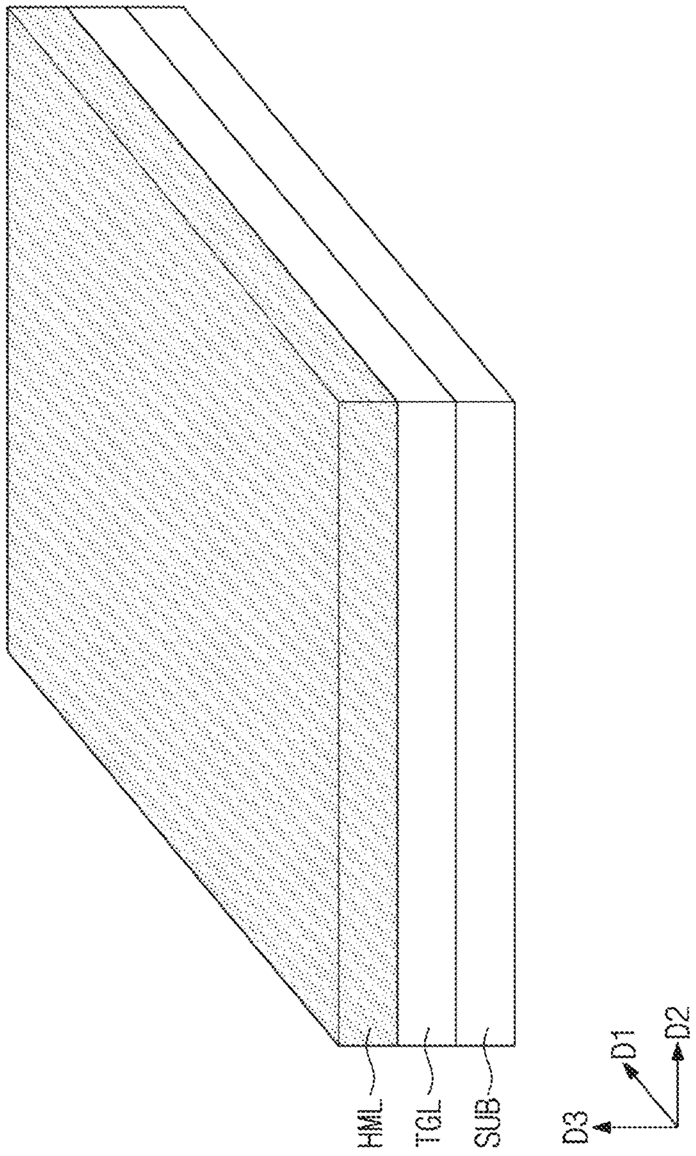
FIG. 11 to FIG. 15 are perspective views for explaining a lithography method according to embodiments of the inventive concept.

Referring to FIG. 11, an etching target layer TGL may be formed on a substrate SUB. In an embodiment, the substrate SUB may be a silicon substrate, a germanium substrate, or a silicon-germanium substrate. The substrate SUB may be a semiconductor wafer. The etching target layer TGL may include a conductive material or an insulating material. The conductive material may include at least one among a semiconductor material (doped silicon, doped germanium, etc.), a conductive metal nitride (titanium nitride, tantalum nitride, etc.), a metal (tungsten, titanium, tantalum, etc.), and a metal-semiconductor compound (tungsten silicide, cobalt silicide, titanium silicide, etc.). The insulating material may include at least one among a silicon oxide layer, a silicon nitride layer, and a silicon oxynitride layer.

A hard mask layer HML may be formed on the etching target layer TGL. The hard mask layer HML may include a material having etching selectivity with respect to the etching target layer TGL. In an embodiment, the hard mask layer HML may include a spin on hardmask (SOH) layer, a spin-on carbon (SOC) layer, an amorphous carbon layer, a silicon layer, a silicon oxide layer, a silicon nitride layer, a silicon oxynitride layer, or a metal layer. The metal layer may include a titanium layer, a tungsten layer, a titanium oxide layer or a titanium nitride layer. In another embodiment of the inventive concept, the hard mask layer HML may be a multi-layer formed using different materials.

Figure 12:
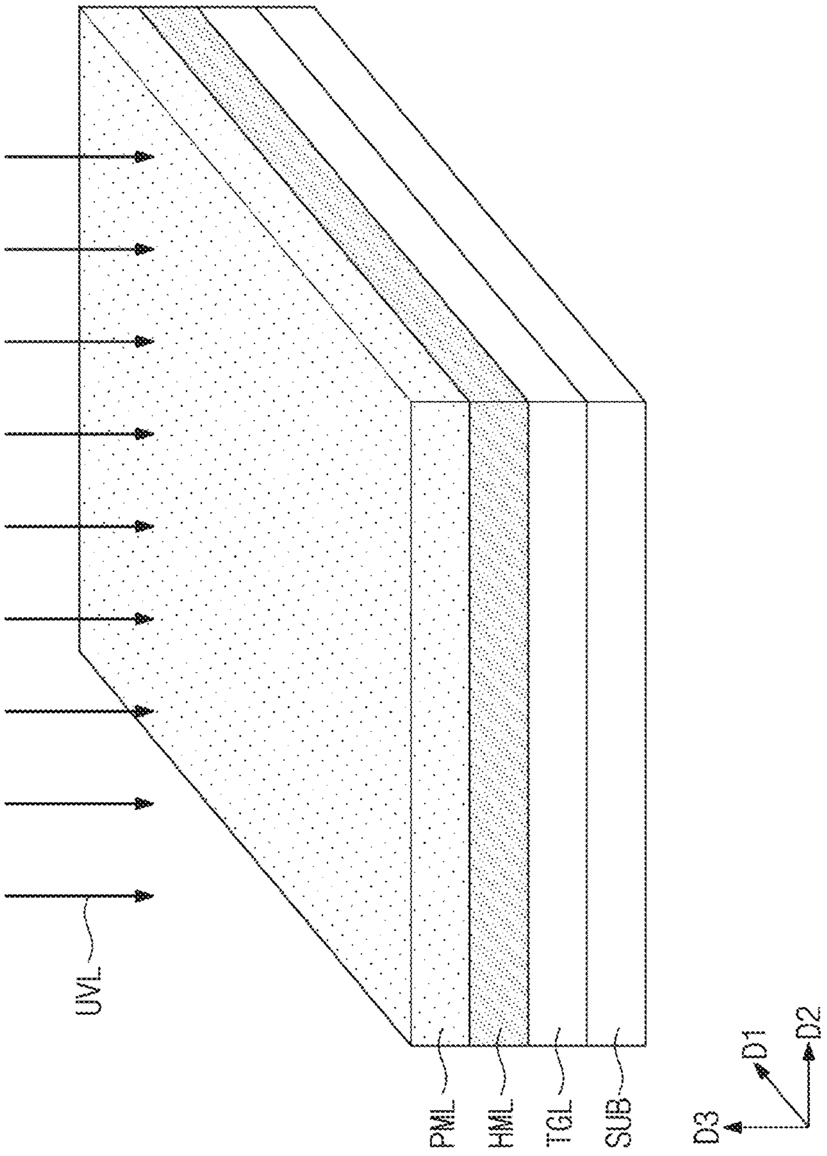

Referring to FIG. 12, a polymer layer PML may be formed on the hard mask layer HML. The polymer layer PML may include the block copolymer according to embodiments of the inventive concept, explained referring to FIG. 3 above. The polymer layer PML may be formed by spin coating a solution containing the block copolymer of the inventive concept on the hard mask layer HML. By irradiating ultraviolet light UVL on the solution or the spin-coated polymer layer PML, the block copolymer in the polymer layer PML may have a cis-structure.

Figure 13:
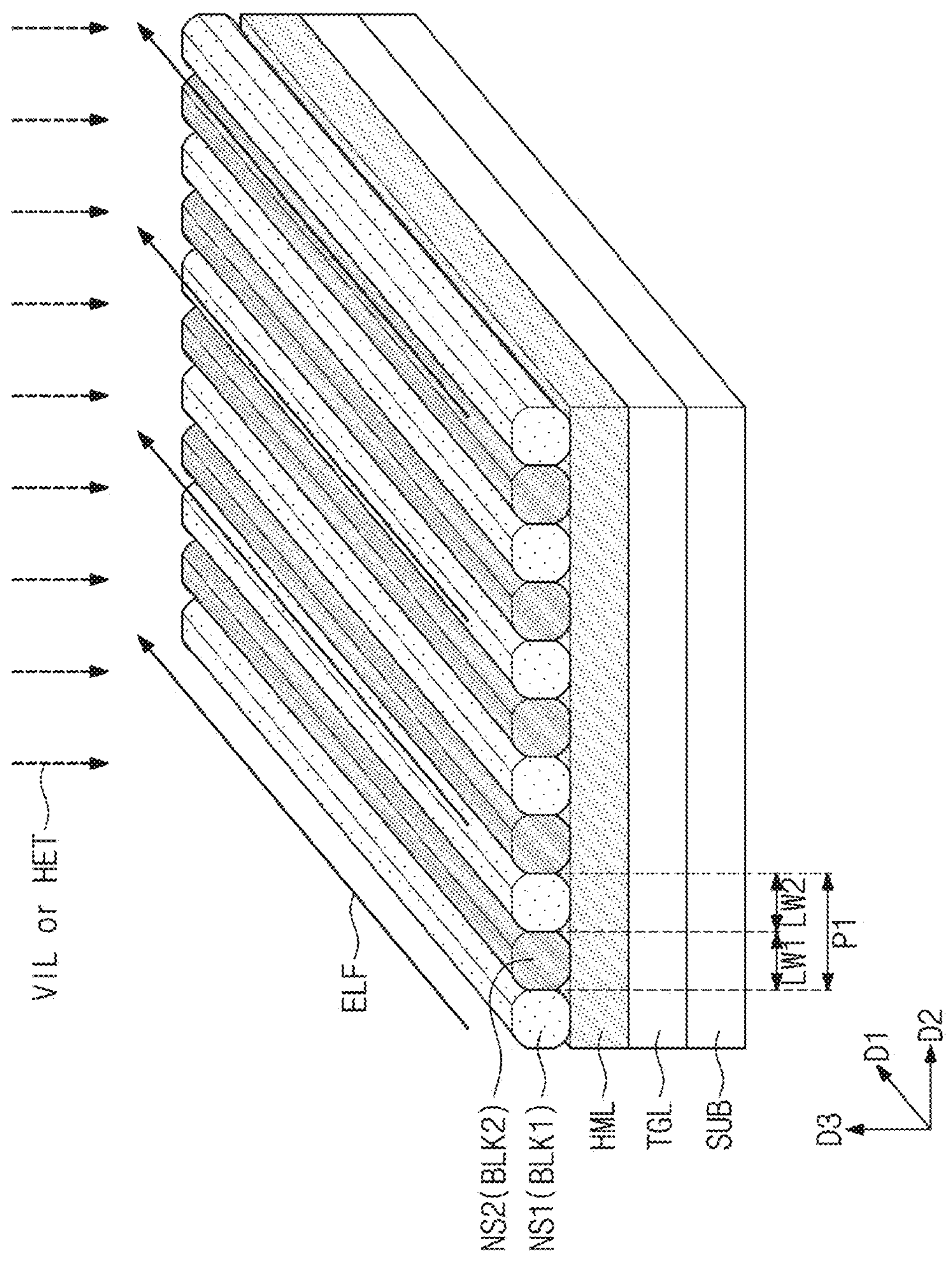

Referring to FIG. 13, an electric filed ELF may be applied in a first direction D1 on the polymer layer PML. Accordingly, the first blocks BLK1 and the second blocks BLK2 of the block copolymer in the polymer layer PML may be self-assembled along the electric field ELF to form first nanostructures NS1 and second nanostructures NS2, respectively. The first nanostructures NS1 may include the first blocks BLK1, and the second nanostructures NS2 may include the second blocks BLK2.

Each of the first nanostructures NS1 and the second nanostructures NS2 may have a horizontal cylindrical structure extended in the first direction D1. When viewed from a plane, each of the first nanostructures NS1 and the second nanostructures NS2 may have a line shape extended in the first direction D1. The first and second nanostructures NS1 and NS2 may be alternately arranged along the second direction D2.

Adjacent second nanostructures NS2 may have a first pitch P1 in the second direction D2. Adjacent first nanostructures NS1 may also have the first pitch P1 in the second direction D2. The first pitch P1 may be about 16 nm to about 40 nm.

The second nanostructure NS2 may have a first line width LW1, and the first nanostructure NS1 may have a second line width LW2. The first line width LW1 and the second line width LW2 may be the same or different. Each of the first line width LW1 and the second line width LW2 may be about 8 nm to about 20 nm.

As described above, since the block copolymer of the inventive concept has the volume fraction of the first block BLK1 of about 0.45 to about 0.55, the first and second nanostructures NS1 and NS2 of the cylindrical structure as in FIG. 13 could be easily formed.

If the block copolymer has a lamellar phase, in order to form the first and second nanostructures NS1 and NS2 as in FIG. 13, the first layer of the first block BLK1 and the second layer of the second block BLK2 in FIG. 2B are required to stand vertically.

In order to arrange the lamellar structure of the block copolymer vertically, neutral layers are essentially formed above and under the polymer layer PML, respectively. Although the neutral layers are formed, the complete vertical arrangement of the lamellar structure of the block copolymer is very difficult, and there are unstable defects in the process.

On the contrary, the block copolymer according to the inventive concept has a cylindrical phase, and the cylindrical structure is structurally more stable if it is laid horizontally. Accordingly, the first and second structures NS1 and NS2 as in FIG. 13 may be easily formed only with the application of the electric field ELF without separate treatment. Accordingly, the lithography process according to the inventive concept may show excellent process efficiency.

After applying the electric field ELF, by irradiating visible light VIL on the first and second nanostructures NS1 and NS2 or by heating thereof, the second nanostructures NS2 may achieve a trans-structure having solidity.

Figure 14:
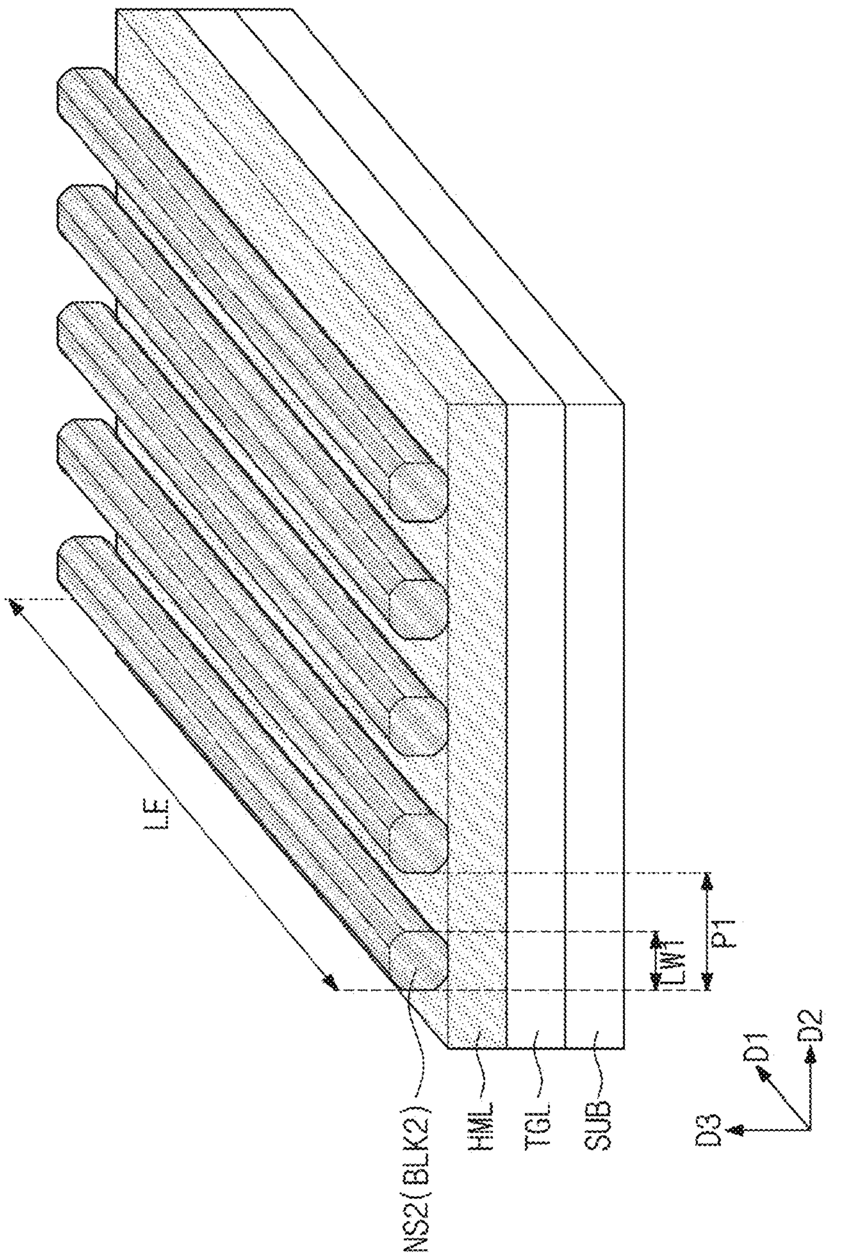

Referring to FIG. 14, a selective etching process may be performed with respect to the first nanostructures NS1 to selectively remove the first nanostructures NS1. Then, only the second nanostructures NS2 may remain on the hard mask layer HML. The second nanostructures NS2 may have a first pitch P1. Each of the second nanostructures NS2 may have a first line width LW1 and a length LE in the first direction D1. In an embodiment of the inventive concept, the ratio (LE/LW1) of the length LE with respect to the first line width LW1 of the second nanostructure NS2 may be about 300 to about 500.

Figure 15:
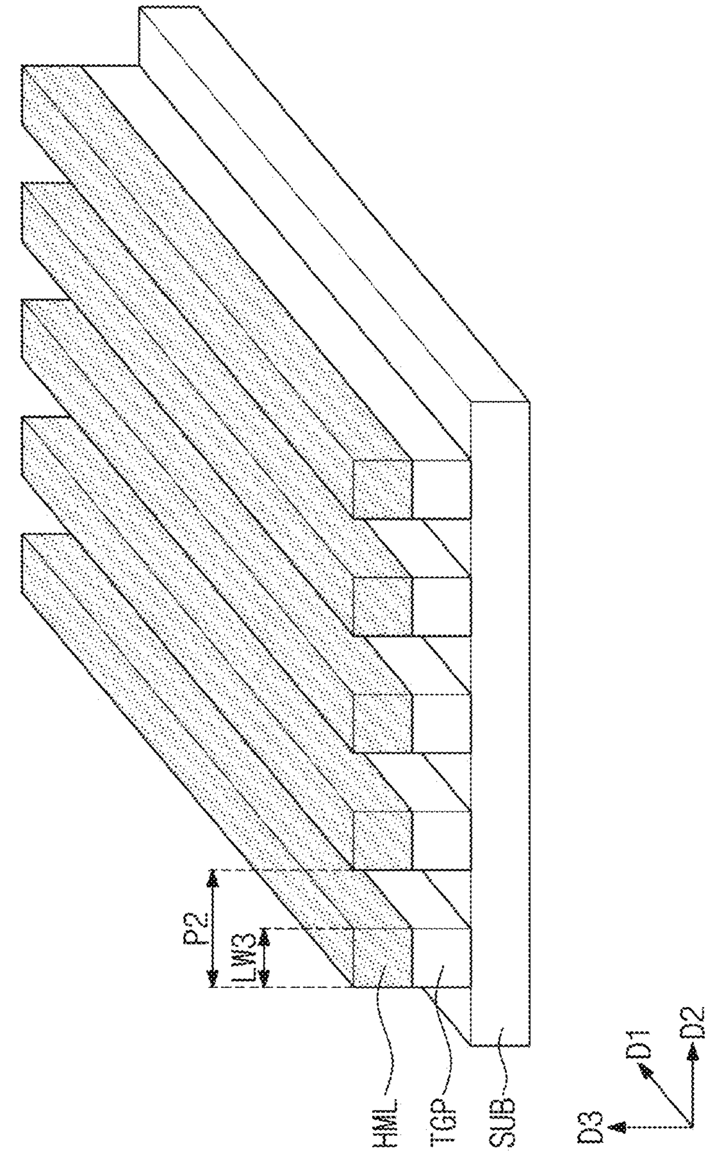

Referring to FIG. 15, the hard mask layer HML may be patterned using the second nanostructures NS2 as an etching mask to form hard mask patterns HWP. The hard mask patterns HWP may be formed corresponding to the second nanostructures NS2. Accordingly, the hard mask patterns HWP may have a second pitch P2 that is substantially the same as the first pitch P1. The hard mask pattern HWP may have a third line width LW3 that is substantially the same as the first line width LW1. After that, remaining second nanostructures NS2 may be selectively removed.

The etching target layer TGL may be patterned using the hard mask patterns HMP as an etching mask to form target patterns TGP. The target patterns TGP may be formed correspondingly to the hard mask patterns HMP.

As a result, according to the lithography using the block copolymer according to the inventive concept, the target patterns TGP of the nanostructure may be formed into a fine pitch. When compared to the minimum pitch of patterns obtained by a EUV lithography process of about 45 nm, the lithography according to the inventive concept may form finer patterns than the EUV lithography process.

Figure 16:
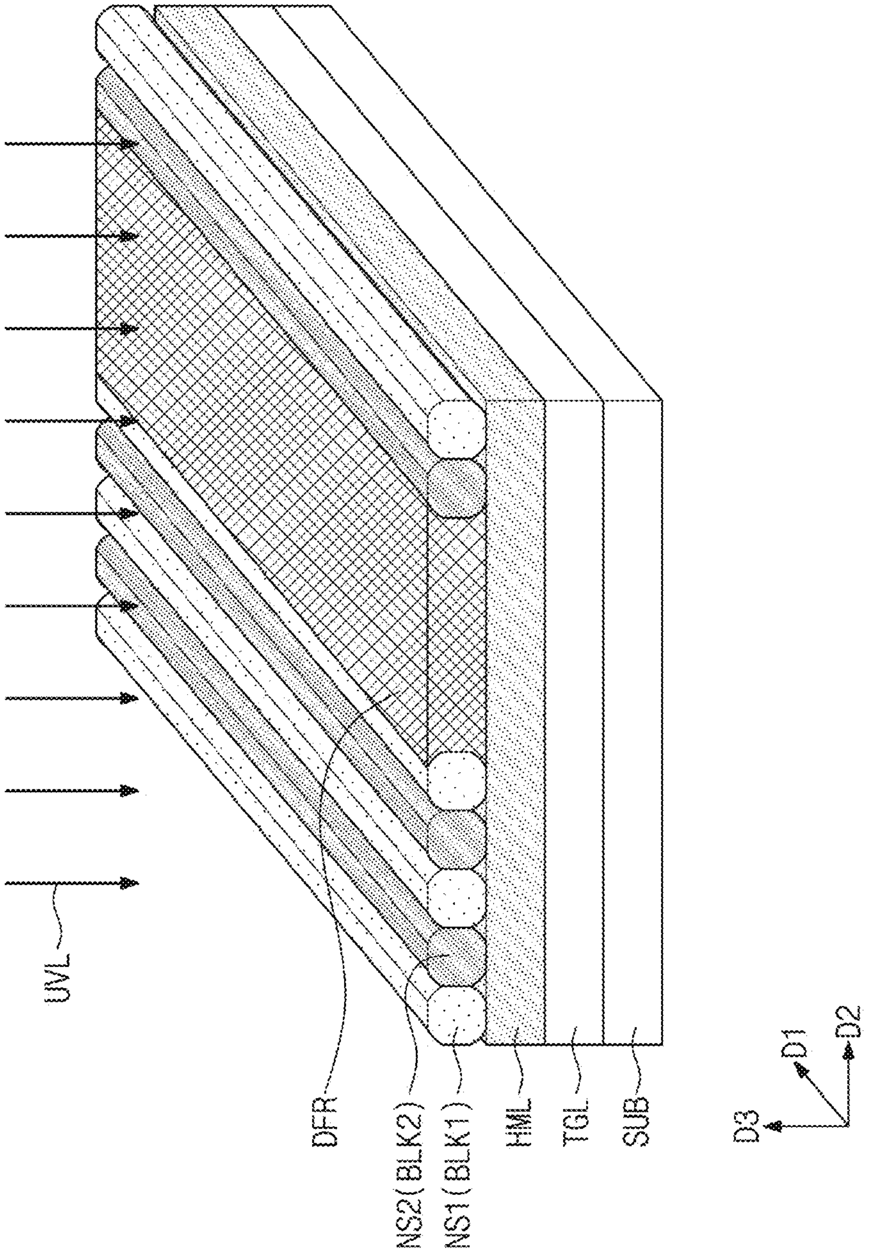
FIG. 16 to FIG. 18 are perspective views for explaining the self-healing method of a nanostructure according to embodiments of the inventive concept.
Figure 17:
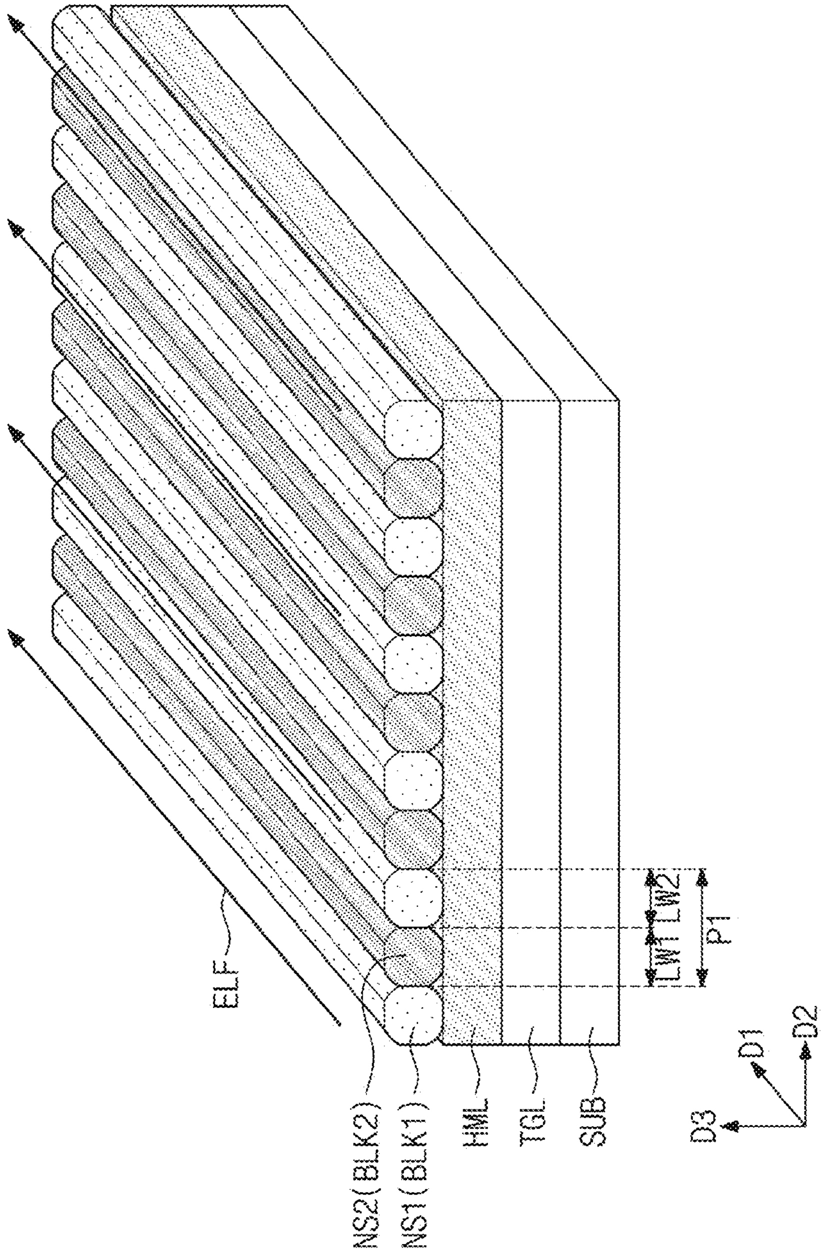
Figure 18:
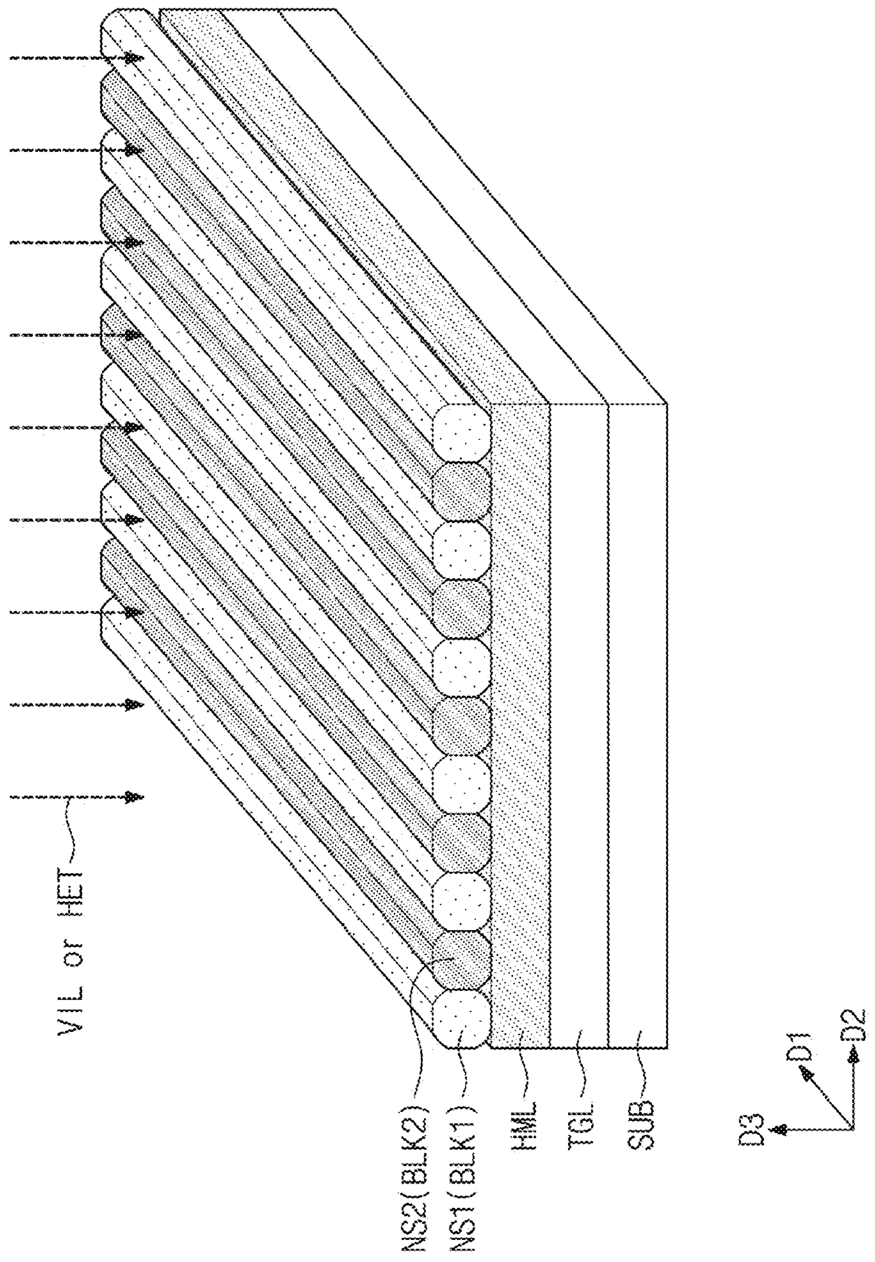

FIG. 16 to FIG. 18 are perspective views for explaining the self-healing method of a nanostructure according to embodiments of the inventive concept. FIG. 16 to FIG. 18 show a method of self-healing and reusing in the case where a damage region DFR is formed on the first and second nanostructures NS1 and NS2 of the inventive concept.

Referring to FIG. 16, a damage region DFR may be formed on the first and second nanostructures NS1 and NS2 during the lithography process explained referring to FIG. 11 to FIG. 15. In the damage region DFR, first and second nanostructures NS1 and NS2 are not formed suitably, and the damage region DFR may act as significant process defect in forming target patterns TGP.

By irradiating ultraviolet light UVL on the first and second nanostructures NS1 and NS2, where the damage region DFR is formed, the block copolymer in the damage region DFR may be transformed into a cis-structure having fluidity.

Referring to FIG. 17, an electric field ELF may be applied again on the first and second nanostructures NS1 and NS2, where the damage region DFR is formed. Accordingly, the block copolymer in the damage region DFR may be self-assembled again along the electric field ELF, and the first and second nanostructures NS1 and NS2 may be formed from the damage region DFR.

Referring to FIG. 18, the first and second nanostructures NS1 and NS2 may be formed from the damage region DFR, and if the damage region DFR is completely removed, visible lights VIL may be irradiated onto the first and second nanostructures NS1 and NS2 or heat HET may be applied. Accordingly, the second nanostructures NS2 may have a hard trans-structure.

In the inventive concept, by utilizing photoisomerization between the cis- and trans-structures of azobenzene, a polymer layer on which damage is formed, could be regenerated into nanostructures. That is, the polymer layer including the block copolymer according to the inventive concept may be self-healed again though being damaged. Accordingly, the lithography method of the inventive concept may show excellent process efficiency.

Figure 19:
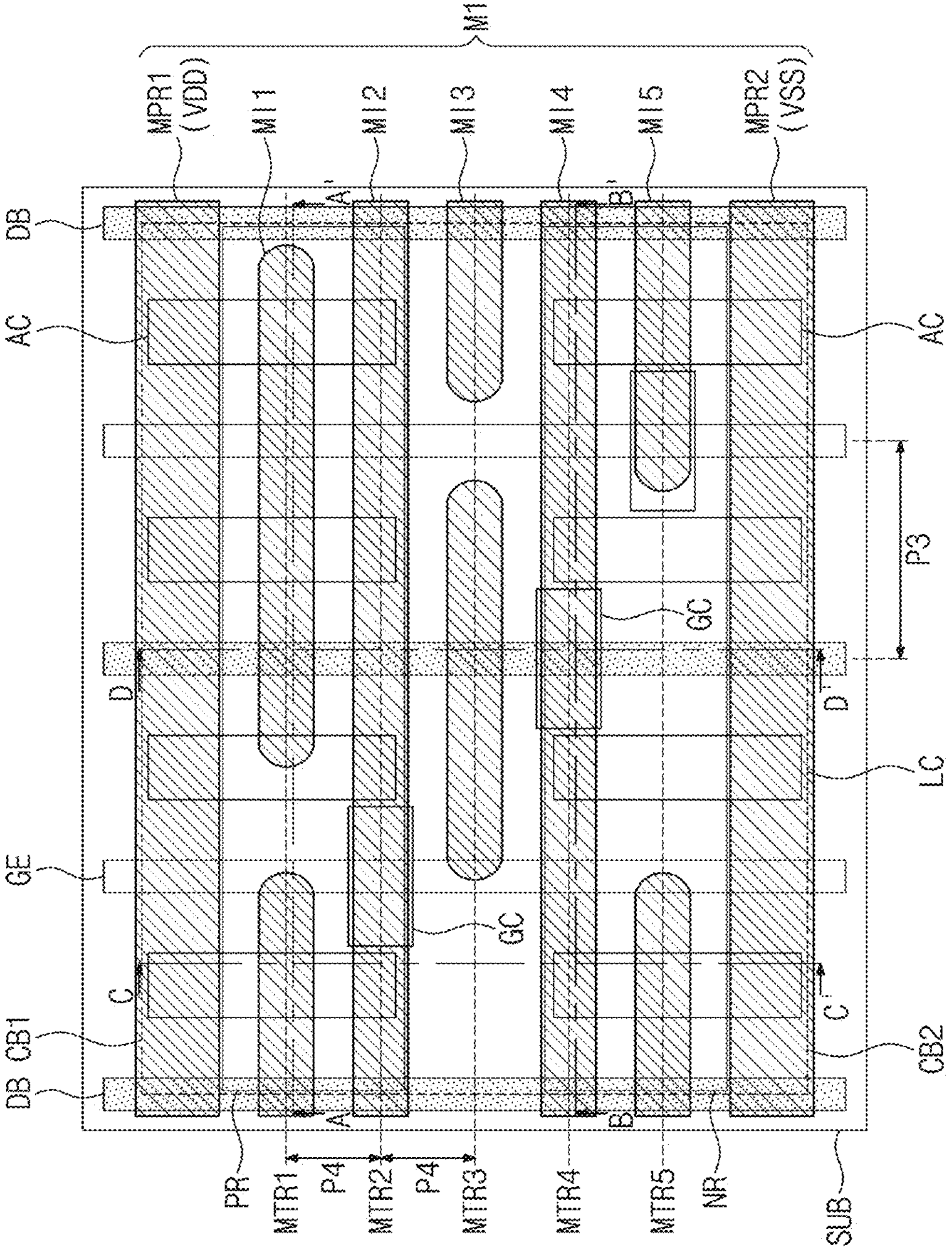
FIG. 19 is a plan view for explaining a semiconductor device according to embodiments of the inventive concept.
Figure 20A:
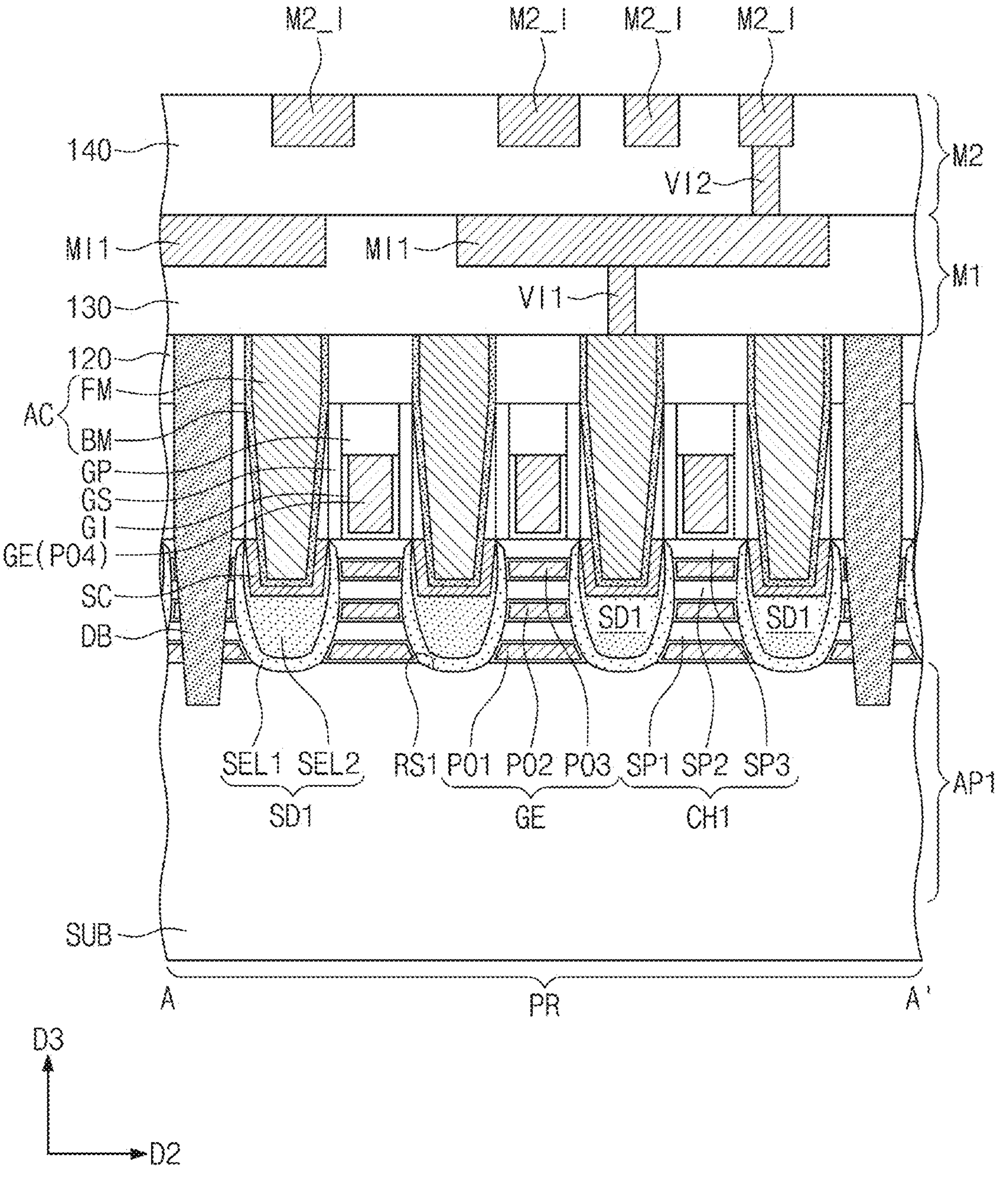
FIG. 20A to FIG. 20D are cross-sectional views along lines A-A', B-B', C-C' and D-D' in FIG. 19.
Figure 20B:
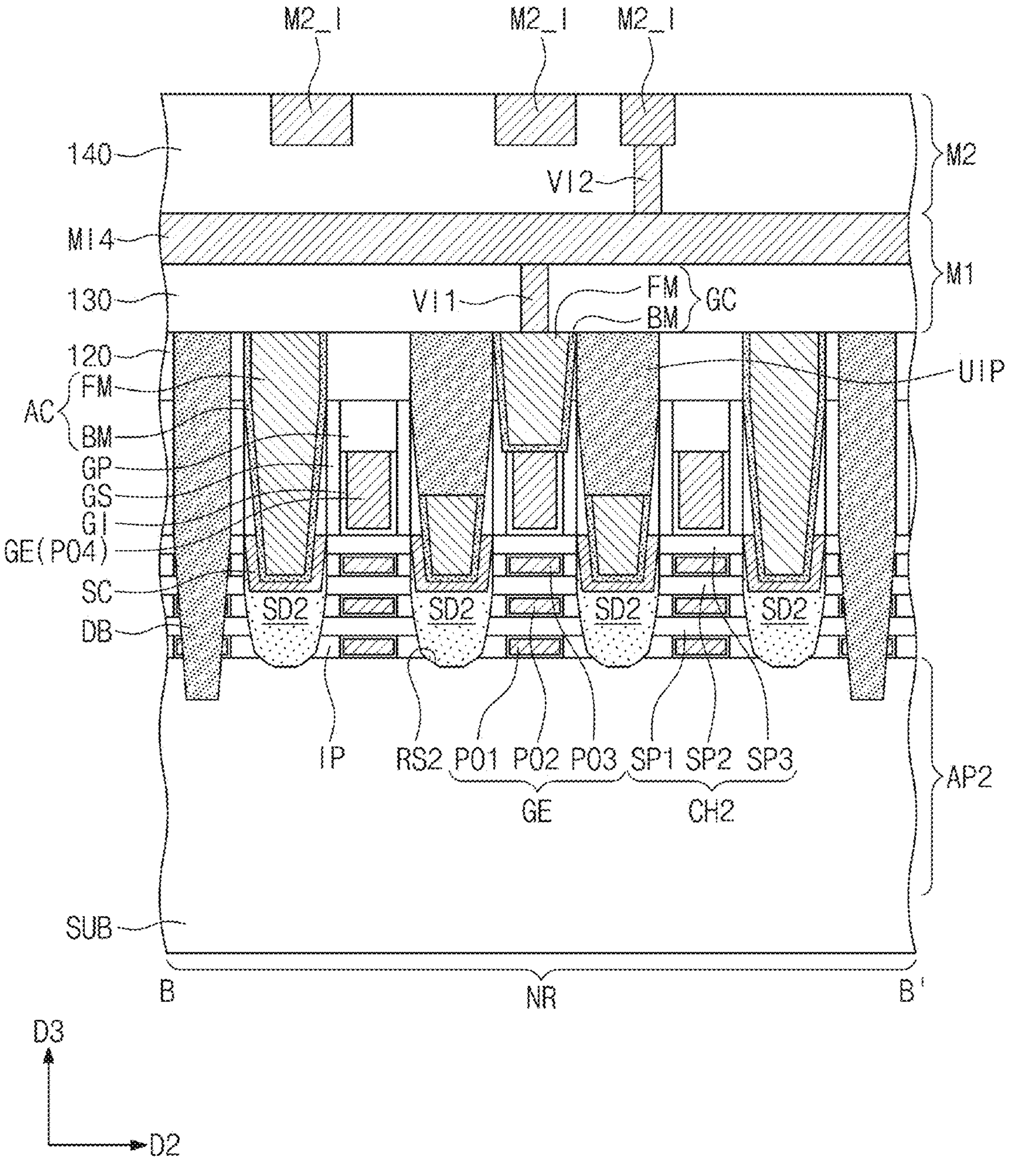
Figure 20C:
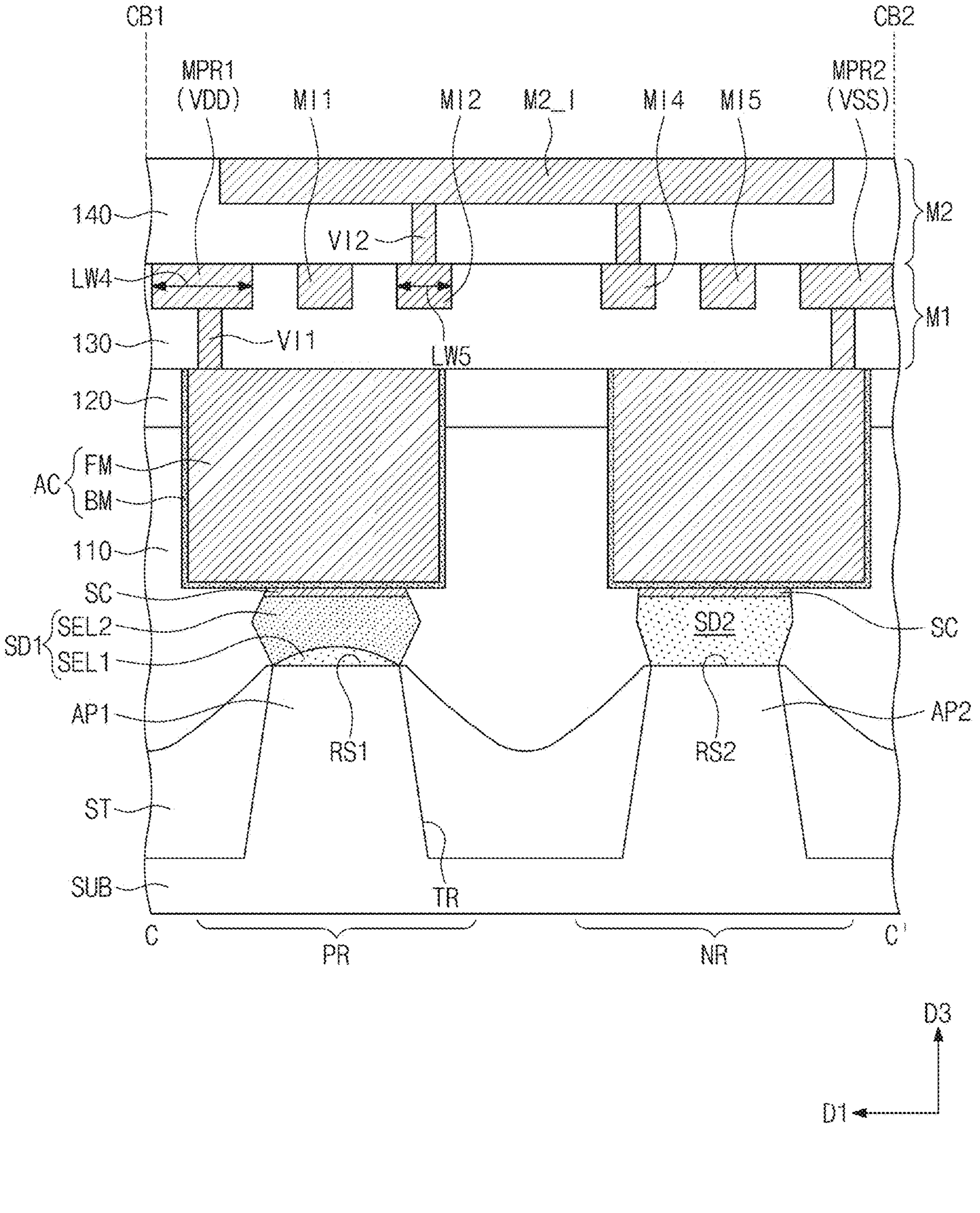
Figure 20D:
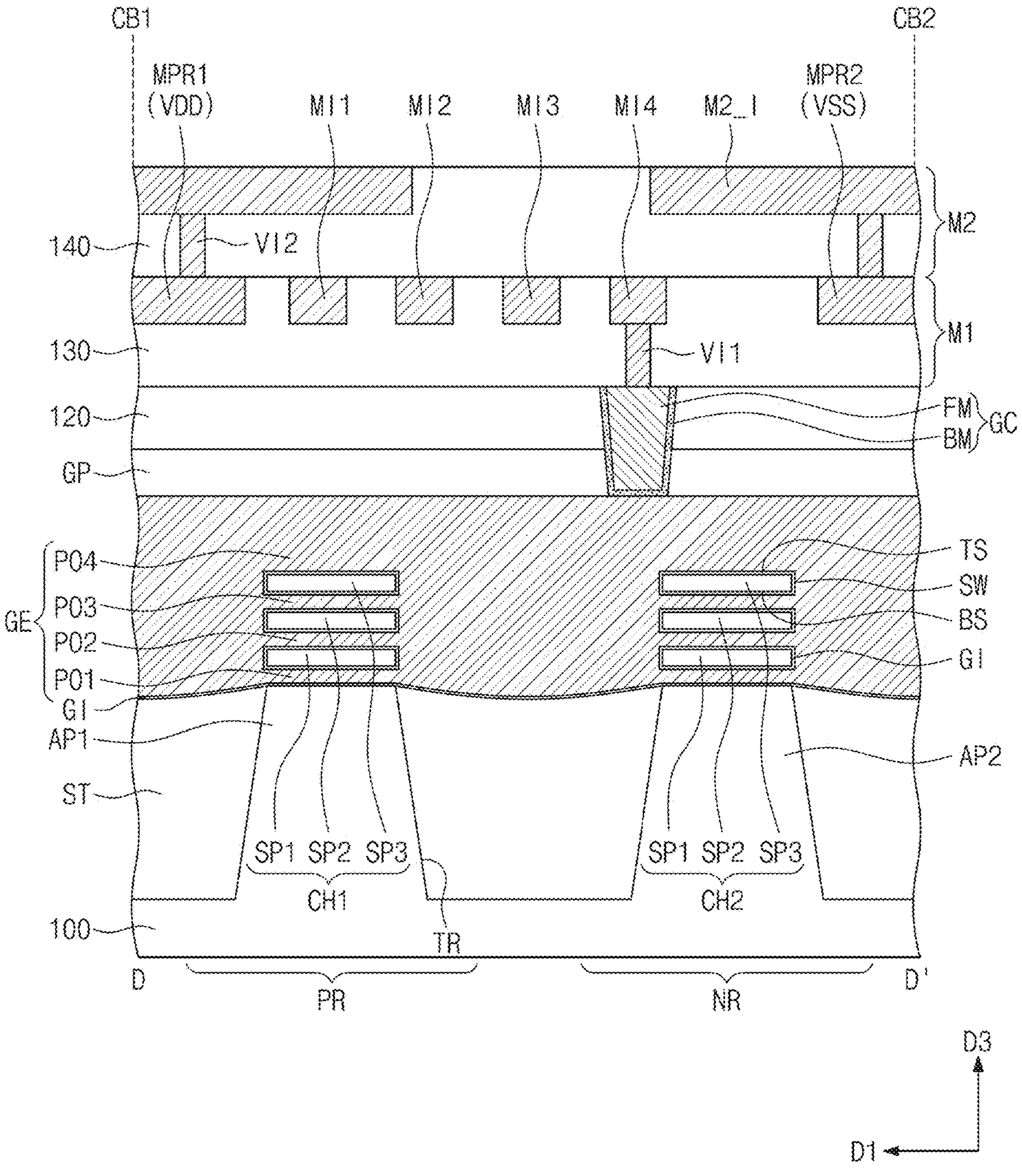

FIG. 19 is a plan view for explaining a semiconductor device according to embodiments of the inventive concept. FIG. 20A to FIG. 20D are cross-sectional views along lines A-A', B-B', C-C' and D-D' in FIG. 19.

Referring to FIG. 19 and FIG. 20A to FIG. 20D, a logic cell LC may be provided on a substrate SUB. The substrate SUB may be a semiconductor substrate including silicon, germanium, silicon germanium, etc., or a compound semiconductor substrate. For example, the substrate SUB may be a silicon substrate.

On the logic cell LC, logic transistors forming a logic circuit may be disposed. The logic cell LC may include a PMOSFET region PR and a NMOSFET region NR. The PMOSFET region PR and the NMOSFET region NR may be separated from each other in a first direction D1.

By a trench TR formed on the substrate SUB, a first active pattern AP1 and a second active pattern AP2 may be defined. The first active pattern AP1 and the second active pattern AP2 may be provided in the PMOSFET region PR and the NMOSFET region NR, respectively. The first and second active patterns AP1 and AP2 may be extended in a second direction D2. The first and second active patterns AP1 and AP2 are parts of the substrate SUB and may be vertically extruded parts.

A device isolation layer ST may fill up the trench TR. The device isolation layer ST may include a silicon oxide layer. The device isolation layer ST may not cover first and second channel patterns CH1 and CH2.

On the first active pattern AP1, a first channel pattern CH1 may be provided. On the second active pattern AP2, a second channel pattern CH2 may be provided. Each of the first channel pattern CH1 and the second channel pattern CH2 may include a first semiconductor pattern SP1, a second semiconductor pattern SP2 and a third semiconductor pattern SP3, stacked in order. The first to third semiconductor patterns SP1, SP2 and SP3 may be separated in a vertical direction (that is, a third direction D3).

Each of the first to third semiconductor patterns SP1, SP2 and SP3 may include silicon (Si), germanium (Ge) or silicon-germanium (SiGe). Preferably, each of the first to third patterns SP1, SP2 and SP3 may include crystalline silicon.

Multiple first source/drain patterns SD1 may be provided on the first active pattern AP1. Multiple first recesses RS1 may be formed on the first active pattern AP1. The first source/drain patterns SD1 may be provided in the first recesses RS1, respectively. The first source/drain patterns SD1 may be impurity regions of a first conductive type (for example, p-type). Between a pair of the first source/drain patterns SD1, the first channel pattern CH1 may be disposed. In other words, the stacked first to third semiconductor patterns SP1, SP2 and SP3 may connect a pair of the first source/drain patterns SD1 from each other.

On the second active pattern AP2, multiple second source/drain patterns SD2 may be provided. On the second active pattern AP2, multiple recesses RS2 may be formed. The second source/drain patterns SD2 may be provided in the second recesses RS2, respectively. The second source/drain patterns SD2 may be impurity regions of a second conductive type (for example, n-type). Between a pair of the second source/drain patterns SD2, a second channel pattern CH2 may be disposed. In other words, the stacked first to third semiconductor patterns SP1, SP2 and SP3 may connect a pair of the second source/drain patterns SD2 from each other.

The first and second source/drain patterns SD1 and SD2 may be epitaxial patterns formed by a selective epitaxial growth (SEG) process. For example, the top surface of each of the first and second source/drain patterns SD1 and SD2 may be positioned at substantially the same level as the top surface of the third semiconductor pattern SP3. In another embodiment, the top surface of each of the first and second source/drain patterns SD1 and SD2 may be higher than the top surface of the third semiconductor pattern SP3.

The first source/drain patterns SD1 may include a semiconductor element (for example, SiGe) having a lattice constant greater than the lattice constant of the semiconductor element of the substrate SUB. Accordingly, a pair of the first source/drain patterns SD1 may provide the first channel pattern CH1 therebetween with a compressive stress. The second source/drain patterns SD2 may include the same semiconductor element (for example, Si) as the substrate SUB.

Each of the first source/drain patterns SD1 may include a first semiconductor layer SEL1 and a second semiconductor layer SEL2 on the first semiconductor layer SELL Referring to FIG. 20A again, the shape of the cross-section of the first source/drain pattern SD1 in the second direction D2 will be explained. The first semiconductor layer SEL1 may cover the inner wall of the first recess RS1. The first semiconductor layer SEL1 may have a U-shape along the profile of the first recess RS1. The second semiconductor layer SEL2 may fill up the remaining region of the first recess RS1 excluding the first semiconductor layer SELL The volume of the second semiconductor layer SEL2 may be greater than the volume of the first semiconductor layer SEL1.

Each of the first semiconductor layer SEL1 and the second semiconductor layer SEL2 may include silicon-germanium (SiGe). Particularly, the first semiconductor layer SEL1 may contain germanium (Ge) in relatively low concentration. In another embodiment of the inventive concept, the first semiconductor layer SEL1 may contain only silicon (Si) excluding germanium (Ge). The concentration of germanium (Ge) of the first semiconductor layer SEL1 may be about 0 at % to about 10 at %.

The second semiconductor layer SEL2 may contain germanium (Ge) in relatively high concentration. In an embodiment, the concentration of germanium (Ge) of the second semiconductor layer SEL2 may be about 30 at % to about 70 at %. The concentration of germanium (Ge) of the second semiconductor layer SEL2 may gradually increase in a third direction D3. For example, the second semiconductor layer SEL2 adjacent to the first semiconductor layer SEL1 has the germanium (Ge) concentration of about 40 at %, but the upper portion of the second semiconductor layer SEL2 may have the germanium (Ge) concentration of about 60 at %.

The first and second semiconductor layers SEL1 and SEL2 may include impurities (for example, boron) so that the first source/drain pattern SD1 may have a p-type. The concentration of impurities (for example, atomic percent) of the second semiconductor layer SEL2 may be greater than the concentration of impurities of the first semiconductor layer SELL Gate electrodes GE crossing the first and second channel patterns CH1 and CH2 and extended in the first direction D1 may be provided. The gate electrodes GE may be arranged according to a third pitch P3 in the second direction D2. Each of the gate electrodes GE may be vertically overlapped with the first and second channel patterns CH1 and CH2.

The gate electrode GE may include a first part PO1 disposed between the active pattern AP1 or AP2, and the first semiconductor pattern SP1, a second part PO2 disposed between the first semiconductor pattern SP1 and the second semiconductor pattern SP2, a third part PO3 disposed between the second semiconductor pattern SP2 and the third semiconductor pattern SP3, and a fourth part PO4 on the third semiconductor pattern SP3.

Referring to FIG. 20A again, the first to third parts PO1, PO2 and PO3 on the gate electrode GE on the PMOSFET region PR may have different widths. For example, the maximum width of the third part PO3 in the second direction D2 may be greater than the maximum width of the second part PO2 in the second direction D2. The maximum width of the first part PO1 in the second direction D2 may be greater than the maximum width of the third part PO3 in the second direction D2.

Referring to FIG. 20D again, the gate electrode GE may be provided on the top surface TS, bottom surface BS and both side walls SW of each of the first to third semiconductor patterns SP1, SP2 and SP3. In other words, the transistor according to this embodiment may be a three-dimensional electric field effect transistor in which the gate electrode GE surrounds the channel three-dimensionally (for example, MBCFET or GAAFET).

Referring to FIG. 19 and FIG. 20A to FIG. 20D, a pair of gate spacers GS may be disposed on the both side walls of the fourth part PO4 of the gate electrode GE. The gate spacers GS may be extended along the gate electrode GE in the first direction D1. The top surfaces of the gate spacers GS may be higher than the top surface of the gate electrode GE. The top surfaces of the gate spacers GS may be co-planar as the top surface of a first interlayer dielectric 110 which will be explained later. The gate spacers GS may include at least one among SiCN, SiCON and SiN. In another embodiment, the gate spacers GS may include a multi-layer composed of at least two among SiCN, SiCON and SiN.

On the gate electrode GE, a gate capping pattern GP may be provided. The gate capping pattern GP may be extended along the gate electrode GE in the first direction D1. The gate capping pattern GP may include a material having etching selectivity with respect to first and second interlayer dielectrics 110 and 120, which will be explained later. Particularly, the gate capping pattern GP may include at least one among SiON, SiCN, SiCON and SiN.

Between the gate electrode GE and the first channel pattern CH1, and between the gate electrode GE and the second channel pattern CH2, a gate insulating layer GI may be disposed. The gate insulating layer GI may cover the top surface TS, bottom surface BS and both side walls SW of each of the first to third semiconductor patterns SP1, SP2 and SP3. The gate insulating layer GI may cover the top surface of the device isolation layer ST under the gate electrode GE (see FIG. 20D).

In an embodiment of the inventive concept, the gate insulating layer GI may include a silicon oxide layer, a silicon nitride layer and/or a high-k layer. The high-k layer may include a high-k material having a higher dielectric constant than a silicon oxide layer. For example, the high-k material may include at least one among hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may include a first metal pattern, and a second metal pattern on the first metal pattern. The first metal pattern may be provided on the gate insulating layer GI and may be adjacent to the first to third semiconductor patterns SP1, SP2 and SP3. The first metal pattern may include a work function metal controlling the threshold voltage of the transistor. By controlling the thickness and composition of the first metal pattern, a desired threshold voltage of the transistor may be achieved. For example, the first to third parts PO1, PO2 and PO3 of the gate electrode GE may be composed of the first metal pattern which is a work function metal.

The first metal pattern may include a metal nitride layer. For example, the first metal pattern may include at least one metal selected from the group consisting of titanium (Ti), tantalum (Ta), aluminum (Al), tungsten (W) and molybdenum (Mo), and nitrogen (N). Further, the first metal pattern may further include carbon (C). The first metal pattern may include stacked multiple work function metal layers.

The second metal pattern may include a metal having lower resistance than the first metal pattern. For example, the second metal pattern may include at least one metal selected from the group consisting of tungsten (W), aluminum (Al), titanium (Ti) and tantalum (Ta). For example, the fourth part PO4 of the gate electrode GE may include the first metal pattern and the second metal pattern on the first metal pattern.

Referring to FIG. 20B again, inner spacers IP may be provided on the NMOSFET region NR. The inner spacers IP may be disposed between the first to third parts PO1, PO2 and PO3, and the second source/drain pattern SD2 of the second gate electrode GE. The inner spacers IP may directly contact with the second source/drain pattern SD2. Each of the first to third parts PO1, PO2 and PO3 of the gate electrode GE may be separated from the second source/drain pattern SD2 by the inner spacer IP.

On the substrate SUB, a first interlayer dielectric 110 may be provided. The first interlayer dielectric 110 may cover the gate spacers GS and the first and second source/drain patterns SD1 and SD2. The top surface of the first interlayer dielectric 110 may be substantially co-planar as the top surface of a gate capping pattern GP and the top surface of a gate spacer GS. On the first interlayer dielectric 110, a second interlayer dielectric 120 covering the gate capping pattern GP may be disposed. In an embodiment, the first and second interlayer dielectrics 110 and 120 may include a silicon oxide layer.

A pair of separation structures DB facing in a second direction D2 may be provided at both sides of a logic cell LC. For example, the isolation structure DB may be provided on the boundary of the logic cell LC. The isolation structure DB may be extended in parallel to the gate electrodes GE in the first direction D1. The pitch between the isolation structure DB and an adjacent gate electrode GE may be the same as the third pitch P3.

The isolation structure DB may pass through the first and second interlayer dielectrics 110 and 120 and may be extended into first and second active patterns AP1 and AP2. The isolation structure DB may pass through first and second channel patterns CH1 and CH2. The isolation structure DB may separate the PMOSFET and NMOSFET regions PR and NR of the logic cell LC from the PMOSFET and NMOSFET regions of another cell.

Active contacts AC passing through the first and second interlayer dielectrics 110 and 120 and electrically connected with the first and second source/drain patterns SD1 and SD2, may be provided. A pair of the active contacts AC may be provided at both sides of the gate electrode GE, respectively. When viewed from a plane, the active contact AC may have a bar shape extended in the first direction D1.

The active contact AC may be a self-aligned contact. In other words, the active contact AC may be formed by a self-alignment manner using the gate capping pattern GP and the gate spacer GS. For example, the active contact AC may cover at least a portion of the side wall of the spacer GS. Though not shown, the active contact AC may cover a portion of the top surface of the gate capping pattern GP.

Between the active contact AC and the first source/drain pattern SD1, and between the active contact AC and the second source/drain pattern SD2, silicide patterns SC may be disposed, respectively. The active contact AC may be electrically connected with the source/drain patterns SD1 and SD2 via the silicide pattern SC. The silicide pattern SC may include metal-silicide and may include, for example, at least one among titanium-silicide, tantalum-silicide, tungsten-silicide, nickel-silicide, and cobalt-silicide.

A gate contact GC passing through the second interlayer dielectric 120 and the gate capping pattern GP and electrically connected with the gate electrode GE, may be provided. For example, referring to FIG. 20B, the upper portion of each of the active contacts AC, adjacent to the gate contact GC may be filled with an upper insulating pattern UIP. Through this, process defects generating short by the contact of the gate contact GC with the adjacent active contact AC may be prevented.

Each of the active contact AC and the gate contact GC may include a conductive pattern FM and a barrier pattern BM surrounding the conductive pattern FM. For example, the conductive pattern FM may include at least one metal among aluminum, copper, tungsten, molybdenum and cobalt. The barrier pattern BM may cover the side walls and the bottom surface of the conductive pattern FM. The barrier pattern BM may include metal layer/metal nitride layer. The metal layer may include at least one among titanium, tantalum, tungsten, nickel, cobalt and platinum. The metal nitride layer may include at least one among a titanium nitride layer (TiN), a tantalum nitride layer (TaN), a tungsten nitride layer (WN), a nickel nitride layer (NiN), a cobalt nitride layer (CoN) and a platinum nitride layer (PtN).

In a third interlayer dielectric 130, a first metal layer M1 may be provided. The first metal layer M1 may include first and second power wirings MPR1 and MPR2, first to fifth lower wirings MI1-MI5, and lower vias VI1. The lower vias VI1 may be provided under the first and second power wirings MPR1 and MPR2, and the first to fifth lower wirings MI1-MI5.

The first and second power wirings MPR1 and MPR2 may be extended in parallel to each other in the second direction D2, while crossing the logic cell LC. To the first and second power wirings MPR1 and MPR2, a drain voltage VDD and a source voltage VSS may be applied, respectively.

Referring to FIG. 19, a first cell boundary CB1 extended in the second direction D2 may be defined in the logic cell LC. On the opposite side of the first cell boundary CB1, a second cell boundary CB2 extended in the second direction D2 may be defined. On the first cell boundary CB1, a first power wiring MPR1 for applying a drain voltage VDD may be disposed. In other words, the first power wiring MPR1 for applying the drain voltage VDD may be extended along the first cell boundary CB1 in the second direction D2. On the second cell boundary CB2, a second power wiring MPR2 for applying a source voltage VSS, i.e., a ground voltage may be disposed. In other words, the second power wiring MPR2 for applying the source voltage VSS may be extended along the second cell boundary CB2 in the second direction D2.

The first to fifth lower wirings MI1-MI5 may be disposed between the first power wiring MPR1 and the second power wiring MPR2. Particularly, between the first power wiring MPR1 and the second power wiring MPR2, first to fifth wiring tracks MTR1-MTR5 may be defined. The first to fifth wiring tracks MTR1-MTR5 may be extended in parallel to each other in the second direction D2. The first to fifth lower wirings MI1-MI5 may be a forth pitch P4 and may be arranged along the first direction D1. For example, the fourth pitch P4 may be smaller than the third pitch P3.

On the first wiring track MTR1, at least one first lower wiring MI1 may be disposed, on the second wiring track MTR2, at least one second lower wiring MI2 may be disposed, on the third wiring track MTR3, at least one third lower wiring MI3 may be disposed, on the fourth wiring track MTR4, at least one fourth lower wiring MI4 may be disposed, and on the fifth wiring track MTR5, at least one fifth lower wiring MI5 may be disposed.

The first to fifth lower wirings MI1-MI5 may be extended in parallel to each other along the first to fifth wiring tracks MTR1-MTR5 in the second direction D2, respectively. When viewed on a plane, each of the first to fifth lower wirings MI1-MI5 may have a line shape or a bar shape.

Each of the first and second power wirings MPR1 and MPR2 may have a fourth line width LW4. Each of the first to fifth wirings MI1-MI5 may have a fifth line width LW5. The fifth line width LW5 may be smaller than the fourth line width LW4 (see FIG. 20C). For example, the fifth line width LW5 may be smaller than about 12 nm. The fourth line width LW4 may be greater than about 12 nm.

The lower vias VI1 may be disposed between the first and second power wirings MPR1 and MPR2, and the active contacts AC. The lower vias VI1 may be disposed between the first to fifth lower wirings MI1-MI5, and active and gate contacts AC and GC.

For example, the first and second power wirings MPR1 and MPR2, and the first to fifth lower wirings MI1-MI5 may include a metal selected from the group consisting of copper (Cu), aluminum (Al), ruthenium (Ru), cobalt (Co), tungsten (W) and molybdenum (Mo).

The wirings MPR1, MPR2 and MI1-MI5 of the first metal layer M1 and the lower vias VI1 thereunder may be formed by separate processes. The wirings MPR1, MPR2 and MI1-MI5 of the first metal layer M1 according to embodiments of the inventive concept may be formed by using a lithography method explained referring to FIG. 11 to FIG. 15. For example, the target patterns TGP of FIG. 15 may be the first to fifth lower wirings MI1-MI5.

In a fourth interlayer dielectric 140, a second metal layer M2 may be provided. The second metal layer M2 may include upper wirings M2_I. Each of the upper wirings M2_I may have a line shape or a bar shape, extended in the first direction D1. In other words, the upper wirings M2_I may be extended in parallel to each other in the first direction D1.

The second metal layer M2 may further include upper vias VI2. The upper vias VI2 may be provided under the upper wirings M2_I. The upper vias VI2 may be disposed between the wirings MPR1, MPR2 and MI1-MI5 of the first metal layer M1 and the upper wirings M2_I.

The upper wirings M2_I may include a metal selected from the group consisting of copper (Cu), aluminum (Al), ruthenium (Ru), cobalt (Co), tungsten (W) and molybdenum (Mo). In an embodiment of the inventive concept, the upper wirings M2_I of the second metal layer M2 may also be formed by using a lithography method explained referring to FIG. 11 to FIG. 15. For example, the target patterns TGP of FIG. 15 may be the upper wirings M2_I.

In an embodiment of the inventive concept, the above-explained gate electrodes GE may also be formed by using a lithography method explained referring to FIG. 11 to FIG. 15. For example, the target patterns TGP of FIG. 15 may be the gate electrodes GE or polysilicone patterns for being replaced with the gate electrodes GE.

In an embodiment of the inventive concept, metal layers (for example, M3, M4, M5, etc.) stacked on the fourth interlayer dielectric 140 may be additionally provided. Each of the stacked metal layers may include routing wirings. The wirings in the stacked metal layers may also be formed by using a lithography method of the inventive concept.

Figure 21:
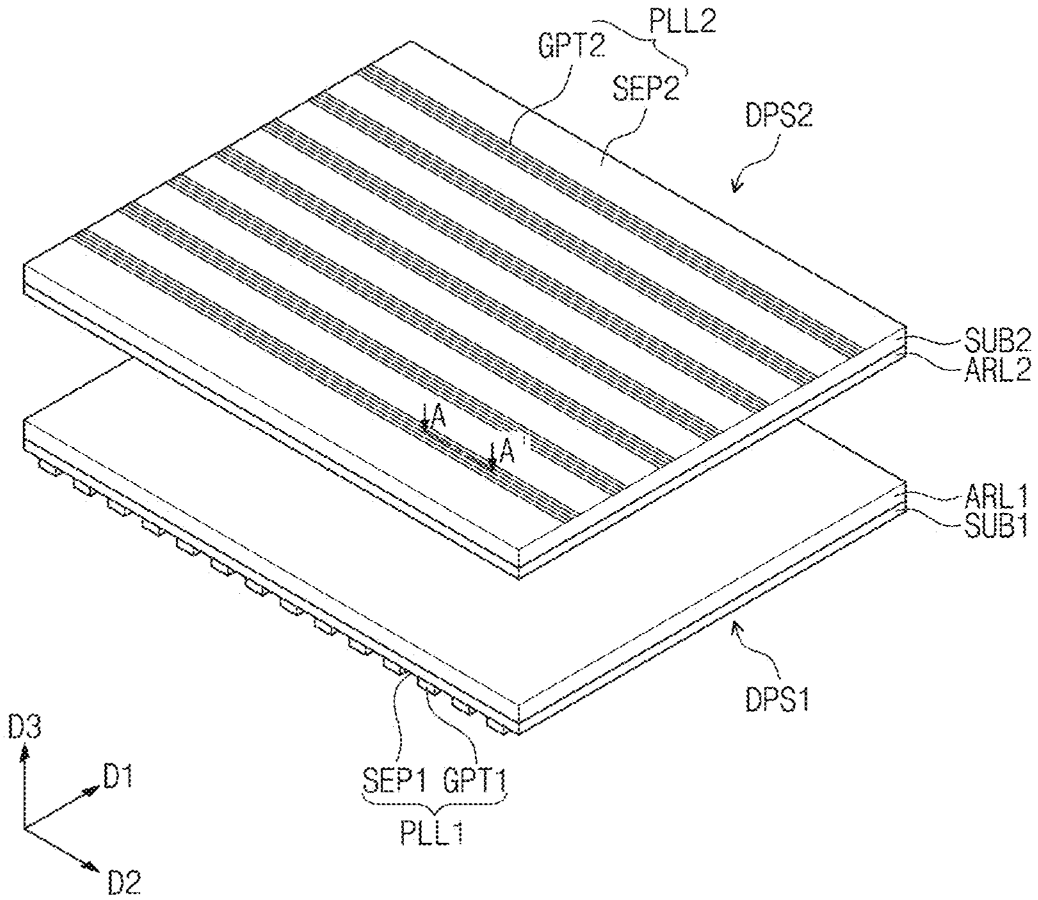
FIG. 21 is a perspective view of a display device according to embodiments of the inventive concept.
Figure 22:
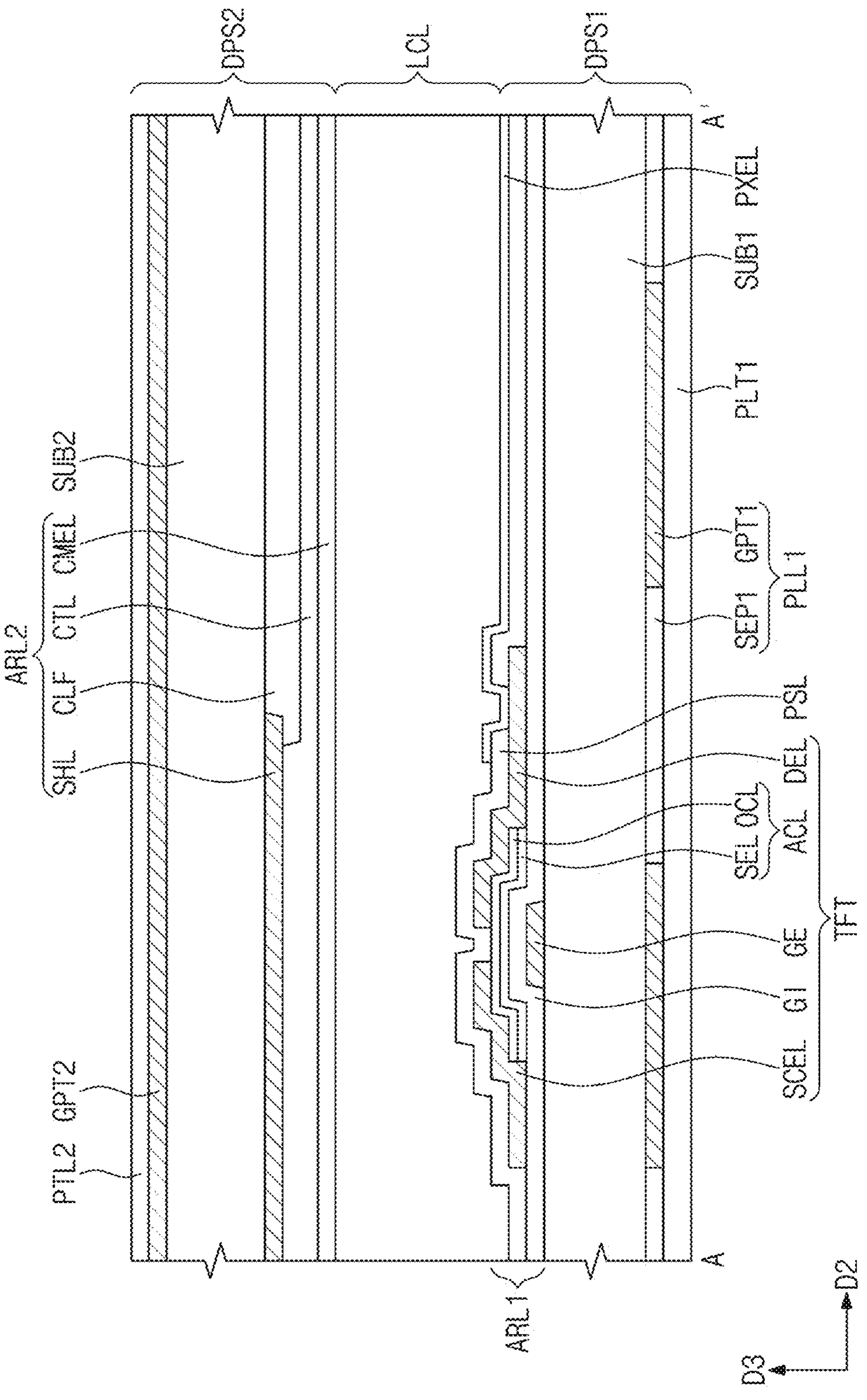
FIG. 22 is a cross-sectional view along line A-A' in FIG. 21.

FIG. 21 is a perspective view of a display device according to embodiments of the inventive concept. FIG. 22 is a cross-sectional view along line A-A' in FIG. 21.

Referring to FIG. 21 and FIG. 22, a display device may include a first display substrate DPS1, a second display substrate DPS2 and a liquid crystal layer LCL. The first display substrate DPS1 may include a first array layer ARL1 and a first polarization layer PLL1 provided on a first substrate SUB1. The first array layer ARL1 may be provided on the first surface of the first substrate SUB1, and the first polarization layer PLL1 may be provided on the second surface of the first substrate SUB1. The first surface of the first substrate SUB1 may be adjacent to the liquid crystal layer LCL. The first display substrate DPS1 may further include a first protection layer PTL1 provided on the first polarization layer PLL1. In an embodiment, the first substrate SUB1 may be a glass substrate.

The first polarization layer PLL1 may include first lattice patterns GPT1. Between adjacent first lattice patterns GPT1, a first separation part SEP1 may be provided. The first separation part SEP1 may partially expose the second surface of the first substrate SUB1. The first lattice patterns GPT1 may have a line shape extended in parallel to each other in the first direction D1. The first lattice patterns GPT1 may be arranged along the second direction D2.

In an embodiment, the first lattice patterns GPT1 may have a stripe shape. The first lattice patterns GPT1 may reflect and/or absorb a portion of light irradiated to the first polarization layer PLL1. For example, the first lattice patterns GPT1 may include aluminum, silver or gold, having high reflectivity. Light irradiated to the first polarization layer PLL1 may pass through the first separation part SEP1 and provided to the liquid crystal layer LCL. In other words, the first polarization layer PLL1 may polarize light irradiated.

The first array layer ARL1 may include multiple pixels. The first array layer ARL1 may include a switching element TFT and a pixel electrode PXEL provided to each pixel. The first array layer ARL1 may further include a passivation layer PSL covering the switching device TFT.

The switching element TFT may include a gate electrode GE, a gate insulating layer GI on the gate electrode GE, an active layer ACL on the gate insulating layer GI, and a source electrode SCEL and a drain electrode DEL on the active layer ACL. The active layer ACL may include a semiconductor layer SEL and an ohmic contact layer OCL between each of source and drain electrodes SCEL and DEL and the semiconductor layer SEL. The pixel electrode PXEL may be provided on the passivation layer PSL, and may be connected with the drain electrode DEL.

The second display substrate DPS2 may include a second array layer ARL2 and a second polarization layer PLL2 provided on a second substrate SUB2. The second array layer ARL2 may be provided on the first surface of the second substrate SUB2. The second polarization layer PLL2 may be provided on the second surface of the second substrate SUB2. The first surface of the second substrate SUB2 may be adjacent to the liquid crystal layer LCL. The second display substrate DPS2 may further include a second protection layer PTL2 provided on the second polarization layer PLL2.

The second polarization layer PLL2 may include second lattice patterns GPT2. Between adjacent second lattice patterns GPT2, a second separation part SEP2 may be provided. The second lattice patterns GPT2 may have a line shape extended in parallel to each other in the second direction D2. The second lattice patterns GPT2 may be arranged along the first direction D1.

In an embodiment, the second lattice patterns GPT2 may have a stripe shape. The second lattice patterns GPT2 may reflect and/or absorb a portion of light passed through the liquid crystal layer LCL. For example, the second lattice patterns GPT2 may include aluminum, silver or platinum, having high reflectivity. The second polarization layer PLL2 may polarize light passed through the liquid crystal layer LCL.

The second array layer ARL2 may include a shading pattern SHL, a color filter CLF, a coating layer CTL and a common electrode CMEL. The shading pattern SHL may divide or define pixels. The color filter CLF may be provided in each pixel.

The first lattice patterns GPT1 according to embodiments of the inventive concept may be formed by using a lithography method explained referring to FIG. 11 to FIG. 15. For example, the target patterns TGP of FIG. 15 may be the first lattice patterns GPT1.

The second lattice patterns GPT2 according to embodiments of the inventive concept may be formed by using a lithography method explained referring to FIG. 11 to FIG. 15. For example, the target patterns TGP of FIG. 15 may be the second lattice patterns GPT2.

The block copolymer according to the inventive concept may have a high Flory-Huggins interaction parameter by the bonding of a first block and a second block, which have different properties through an ATRP synthetic method. The block copolymer has a specific volume fraction of the first block or the second block, and may have a cylindrical phase. The block copolymer is capable of directed self-assembly and self-healing by using the polarization and photosensitive properties of azobenzene.

According to the lithography method according to the inventive concept, a nanostructure having directionality may be formed using the block copolymer. In addition, though a damage region is formed in the nanostructure, the damage region may be converted into the nanostructure again by the self-healing. As a result, the lithography of the inventive concept may form finer patterns than EUV lithography and may have excellent process efficiency.

Although the embodiments of the present invention have been described, it is understood that the present invention should not be limited to the embodiments, but various changes and modifications can be made by one ordinary skilled in the art within the spirit and scope of the present invention as hereinafter claimed.

What is claimed is:

1. A block copolymer for lithography, the block copolymer comprising:

a first block comprising a first repeating unit of Formula 1; and a second block comprising a second repeating unit of Formula 2:

[Formula 1]

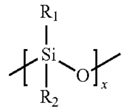

$R_1$ and $R_2$ are each independently hydrogen or a linear or branched C1-C10 alkyl group, and "x" is an integer between 60 and 80,

[Formula 2]

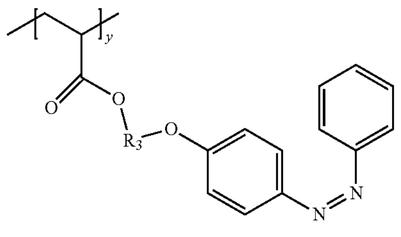

$R_3$ is a linear or branched C1-C10 alkyl group,

"y" is an integer between 15 and 25, and the block copolymer has a cylindrical phase.

2. The block copolymer for lithography of claim 1, wherein a ratio (y/x) of "y" to "x" is about 0.2 to about 0.3.

3. The block copolymer for lithography of claim 1, wherein a ratio of a volume of the first block to a volume of the block copolymer is about 0.45 to about 0.55.

4. The block copolymer for lithography of claim 1, wherein $R_1$ and $R_2$ are methyl groups.

5. The block copolymer for lithography of claim 1, wherein a line width of a cylindrical structure of the second block is about 8 nm to about 20 nm.

6. A method for lithography comprising:

forming a polymer layer comprising a block copolymer on a substrate;

applying an electric field to the polymer layer to form a first nanostructure and a second nanostructure, the first nanostructure and the second nanostructure extending in a first direction and parallel to each other; and selectively removing the first nanostructure, wherein the block copolymer comprises:

a first block including a repeating unit of polymerized siloxane; and a second block including a repeating unit of polymerized alkyl azobenzene acrylate, the alkyl is a linear or branched chain of 1 to 10 carbon atoms, a number (x) of the repeating unit of the polymerized siloxane is 60 to 80, a number (y) of the repeating unit of the alkyl azobenzene acrylate is 15 to 25, the first nanostructure comprises the first block, and the second nanostructure comprises the second block.

7. The lithography method of claim 6, further comprising irradiating visible light to the first nanostructure and the second nanostructure, during or after applying the electric field.

8. The lithography method of claim 6, wherein the second nanostructure has a cylindrical structure formed using the second block.

9. The lithography method of claim 8, wherein the cylindrical structure extends horizontally in the first direction.

10. The lithography method of claim 6, wherein the forming of the polymer layer comprises spin coating a solution containing the block copolymer on the substrate.

11. The lithography method of claim 6, further comprising irradiating ultraviolet light to the block copolymer, before or during formation of the polymer layer.

12. The lithography method of claim 6, wherein a line width of each of the first nanostructure and the second nanostructure is about 8 nm to about 20 nm.

13. The lithography method of claim 6, wherein a ratio of a length of the second nanostructure in the first direction to a line width of the second nanostructure is about 300 to about 500.

14. The lithography method of claim 6, further comprising:

irradiating ultraviolet light to a damage region between the first nanostructure and the second nanostructure; and applying an electric field again to the damage region to form at least one nanostructure extending in the first direction.

15. A method of manufacturing a semiconductor device, the method comprising:

forming transistors on a substrate; and forming wirings on the transistors, the wirings extending in a first direction, wherein the forming of the wirings comprises:

forming an etch target layer on the transistors;

forming a polymer layer comprising a block copolymer on the etch target layer;

applying an electric field to the polymer layer to form first nanostructures and second nanostructures, the first nanostructures and the second nanostructures extending in the first direction and parallel to each other;

selectively removing the first nanostructures; and patterning the etch target layer using the second nanostructures as an etching mask, the block copolymer comprises:

a first block including a polymer of a silicon (Si) backbone; and a second block including a repeating unit of polymerized monomers, each of the monomers comprising azobenzene, a ratio of a volume of the first block to a volume of the block copolymer is about 0.45 to about 0.55, each of the first nanostructures comprises the first block, and each of the second nanostructures comprises the second block.

16. The method of manufacturing a semiconductor device of claim 15, wherein the first nanostructures and the second nanostructures are alternately arranged in a second direction which crosses the first direction.

17. The method of manufacturing a semiconductor device of claim 15, wherein the second nanostructures have a cylindrical structure formed using the second block.

18. The method of manufacturing a semiconductor device of claim 15, wherein a line width of each of the second nanostructures is about 8 nm to about 20 nm, and a line width of each of the wirings is about 8 nm to about 20 nm.

19. The method of manufacturing a semiconductor device of claim 15, wherein a ratio of a length of the second nanostructures in the first direction to a line width of the second nanostructures is about 300 to about 500.

20. The method of manufacturing a semiconductor device of claim 15, wherein a degree of polymerization of the first block is 60 to 80, and a degree of polymerization of the second block is 15 to 25.

* * * * *